United States Patent [19]

Ohsawa

[11] Patent Number: 4,802,132
[45] Date of Patent: Jan. 31, 1989

[54] SEMICONDUCTOR MEMORY DEVICE

[75] Inventor: Takashi Ohsawa, Kawasaki, Japan

[73] Assignee: Kabushiki Kaisha Toshiba, Kawasaki, Japan

[21] Appl. No.: 122,332

[22] Filed: Nov. 18, 1987

[30] Foreign Application Priority Data

Nov. 27, 1986 [JP] Japan .................. 61-280595

[51] Int. Cl.$^4$ .............................. G11C 8/00
[52] U.S. Cl. ..................... 365/230; 365/233
[58] Field of Search ............... 365/189, 230, 231, 233

[56] References Cited

U.S. PATENT DOCUMENTS 4,562,555 12/1985 Ouchi et al. ..................... 365/233
4,685,088 8/1987 Fannucci ......................... 365/230

OTHER PUBLICATIONS

Takasugi, et al., "A Data-Transfer Architecture For Fast Multi-Bit Serial Access Mode DRAM," ES-SCIRC'85 11th European Solid-State Circuits Conference, pp. 161-165, Sep. 16-18, 1985.

*Primary Examiner*—Joseph A. Popek

*Attorney, Agent, or Firm*—Finnegan, Henderson, Farabow, Garrett, & Dunner

[57] ABSTRACT

A semiconductor memory device includes a memory cell array having N memory blocks; N buffers respectively connected to the memory blocks; drivers, data selection circuits for selecting data to or from the drivers, a plurality of data buses connected to the data selection circuits, and a control unit for supplying control signals to said data selection circuits in each operation cycle, causing the data buses to be sequentially connected to the drivers via the data selection circuits, thereby permitting serial data to be transferred with respect to the memory cell array means via the data buses. The buffers are divided into n groups, n buffer selection circuits are each connected between a corresponding one of groups of the buffers and a corresponding one of the data buses, and the control unit supplies control signals to the buffer selection circuits, causing one of the buffers to be selectively connected to a corresponding one of the data buses via a corresponding one of the buffer selection circuits, and causing the data buses to be sequentially connected to the drivers via the data selection circuits, thereby permitting serial data to be transferred with respect to the memory cell array via the data buses.

8 Claims, 27 Drawing Sheets

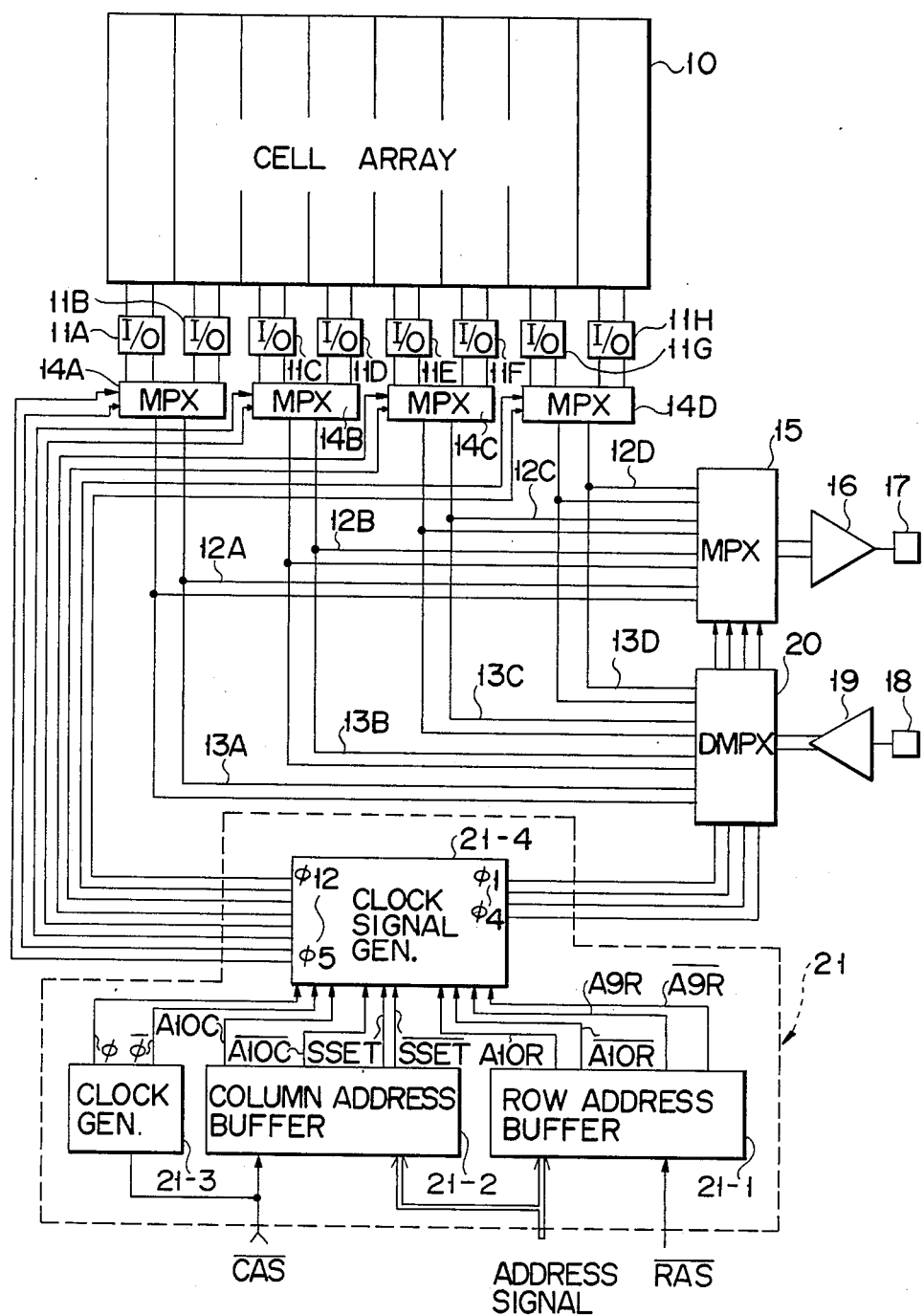
F I G. 3

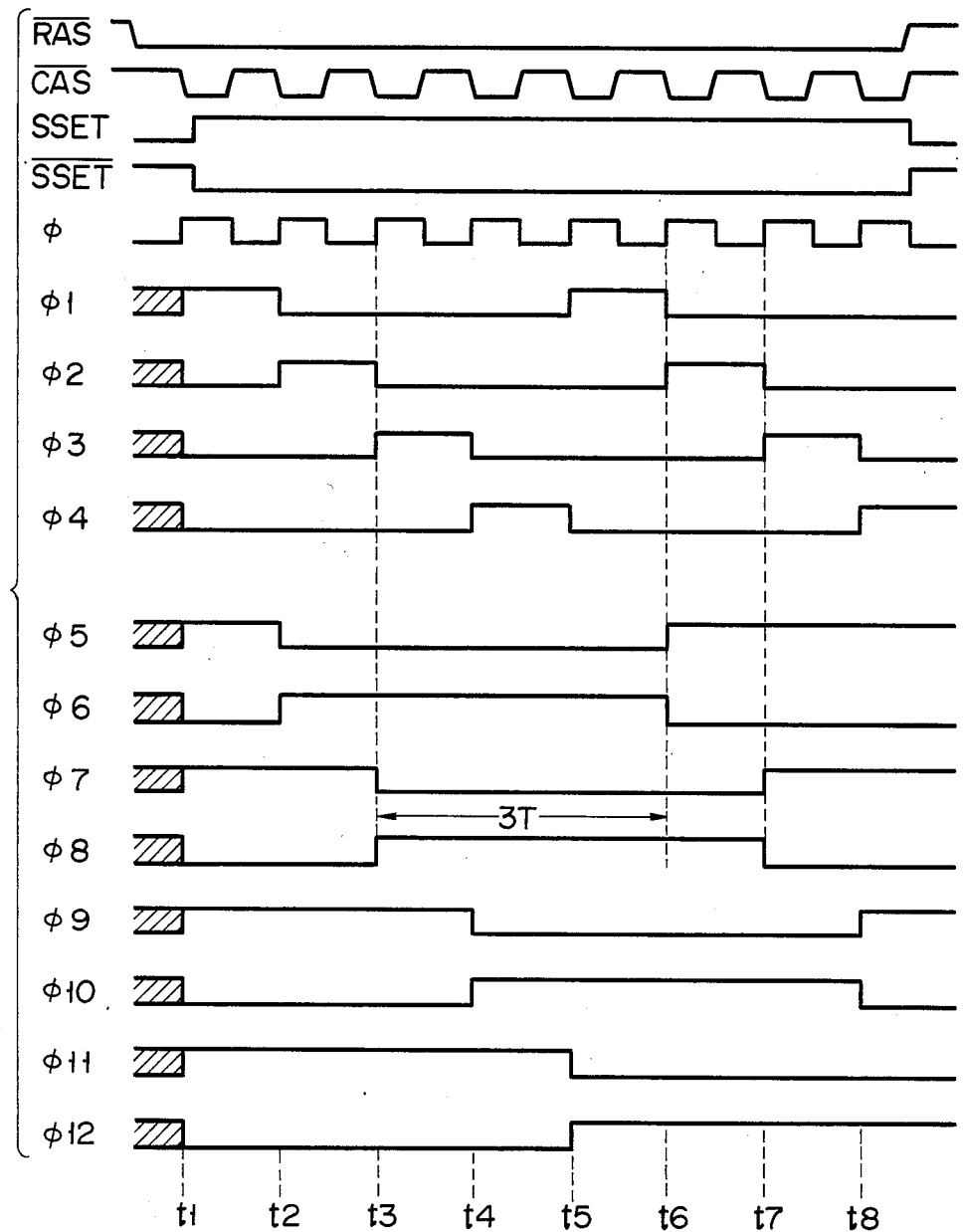
F I G. 4

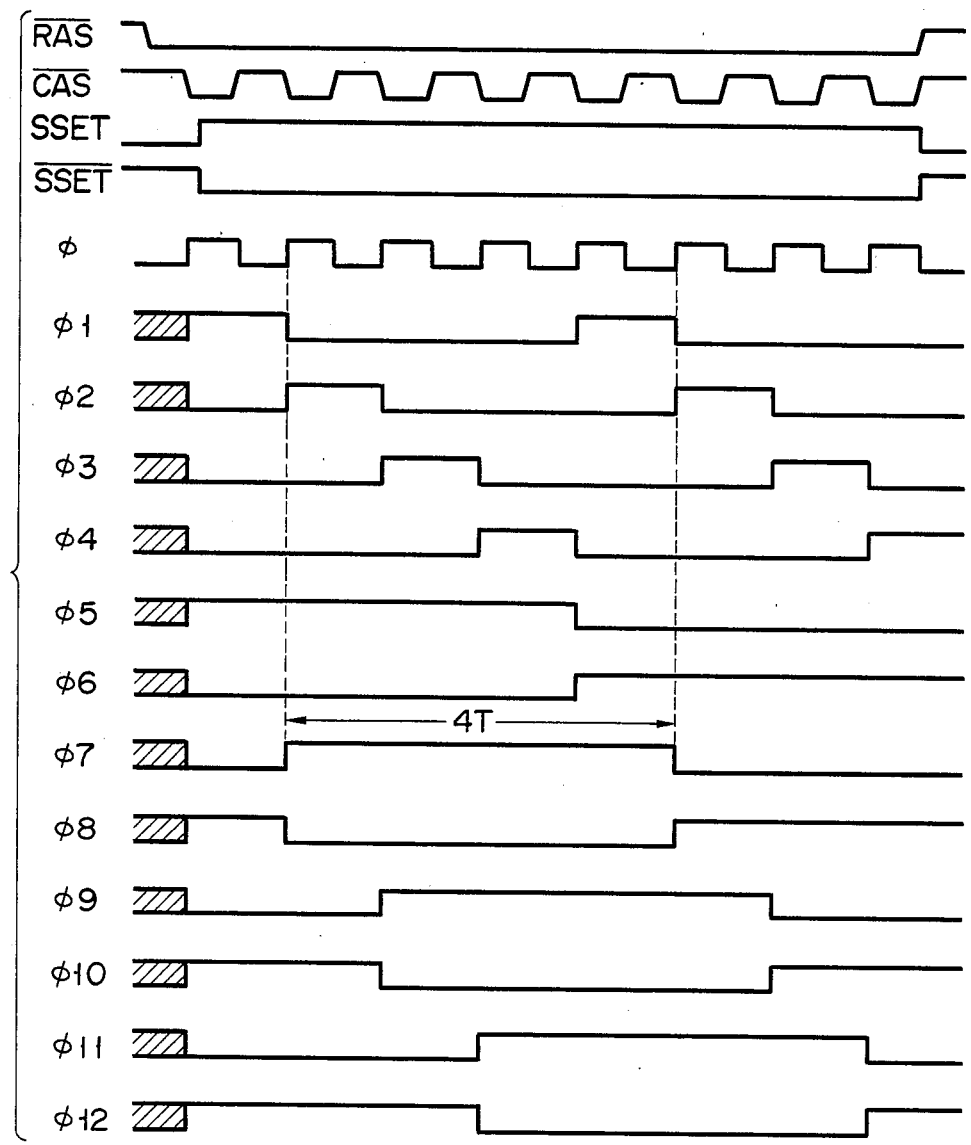
F I G. 5

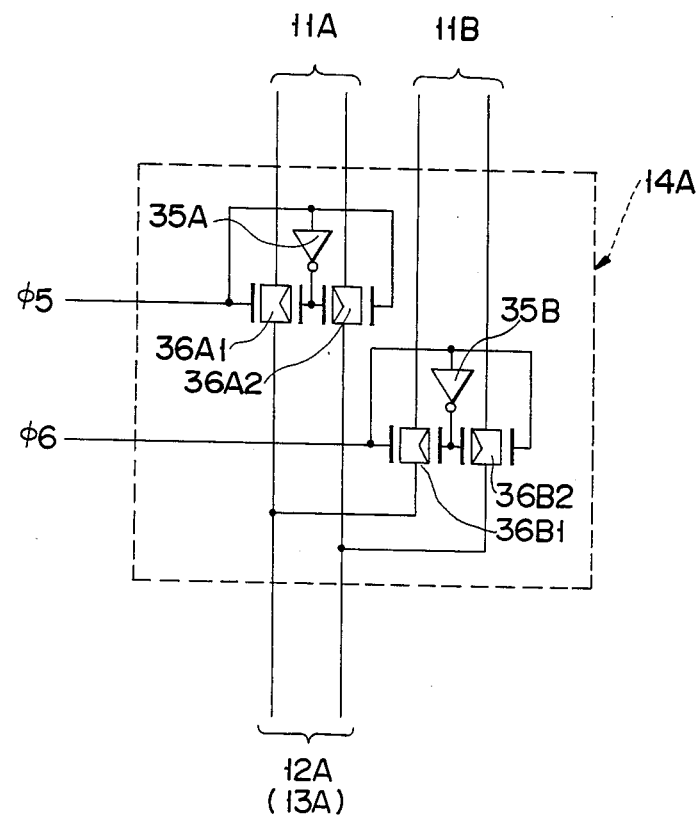
F I G. 9

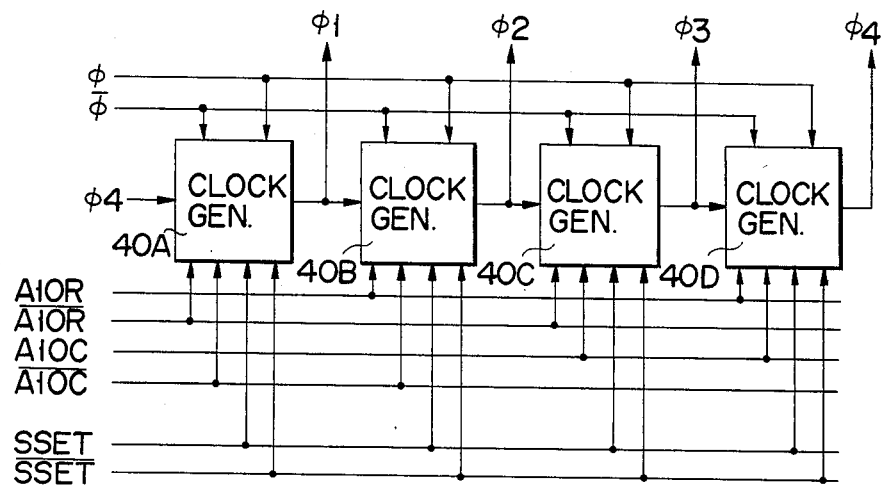
F I G. 10
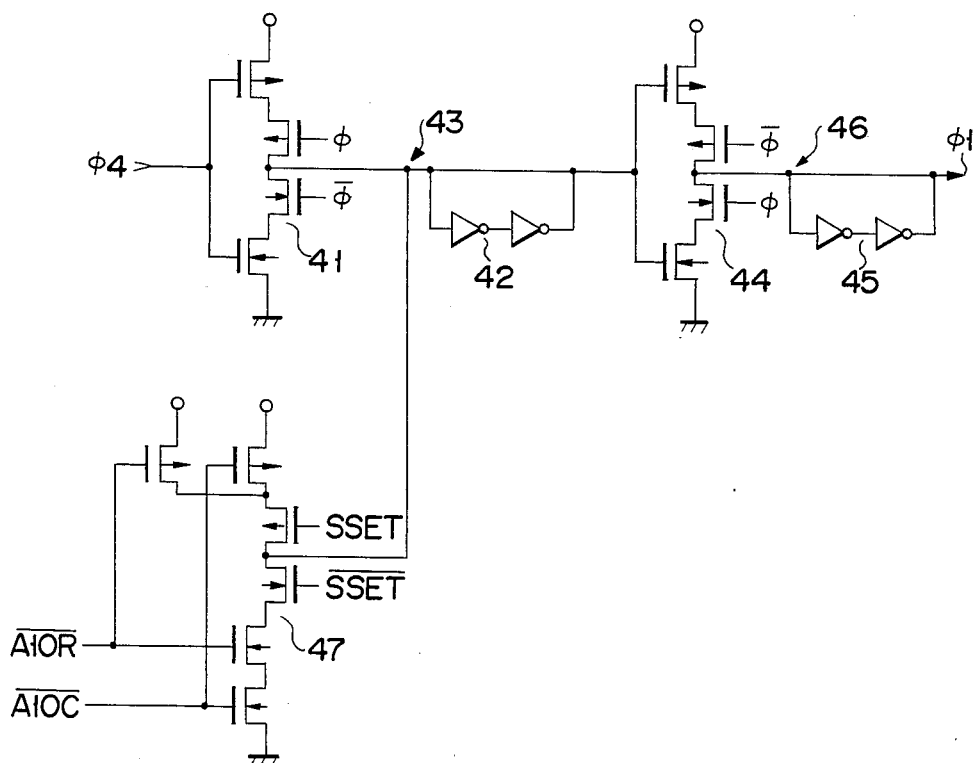
F I G. 11

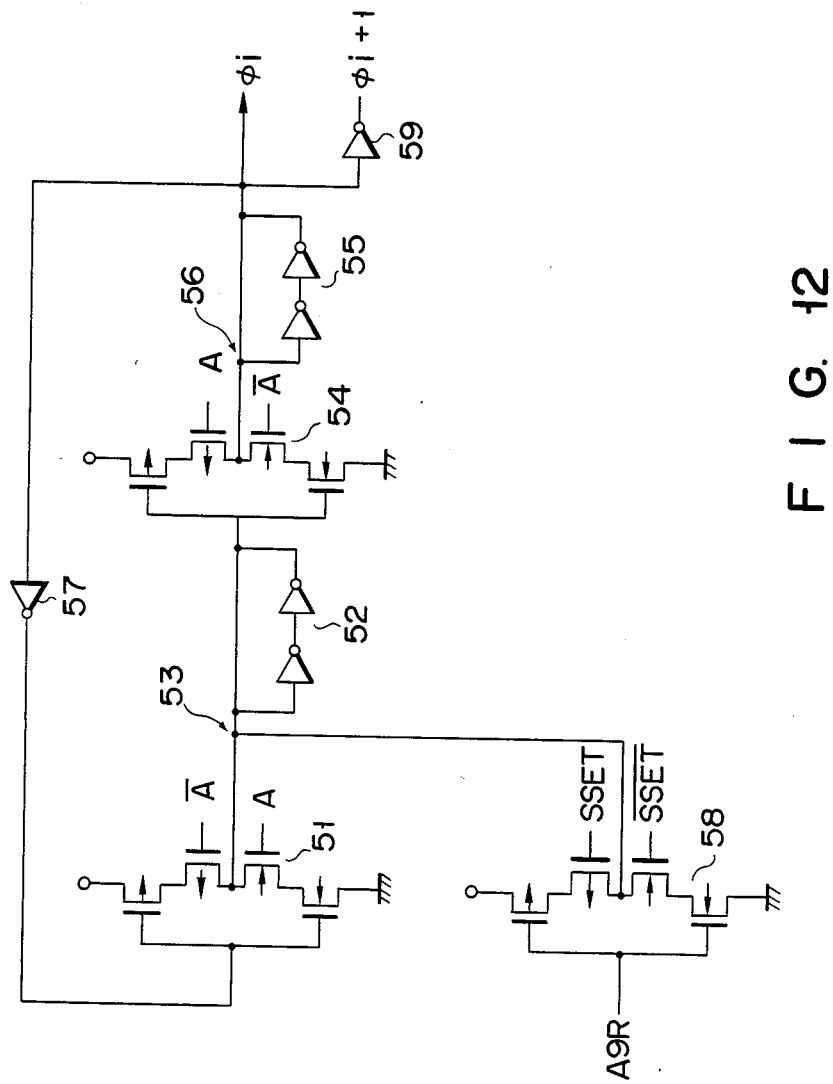
F I G. 12

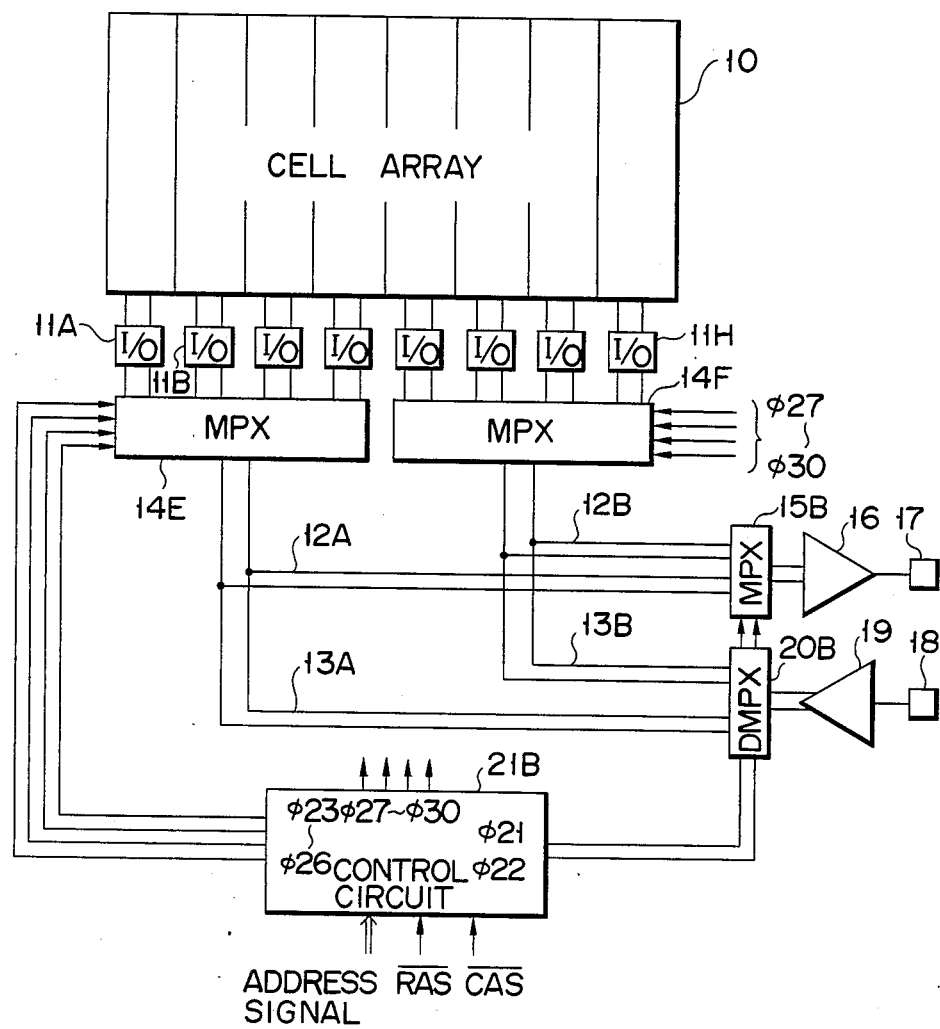
F I G. 13

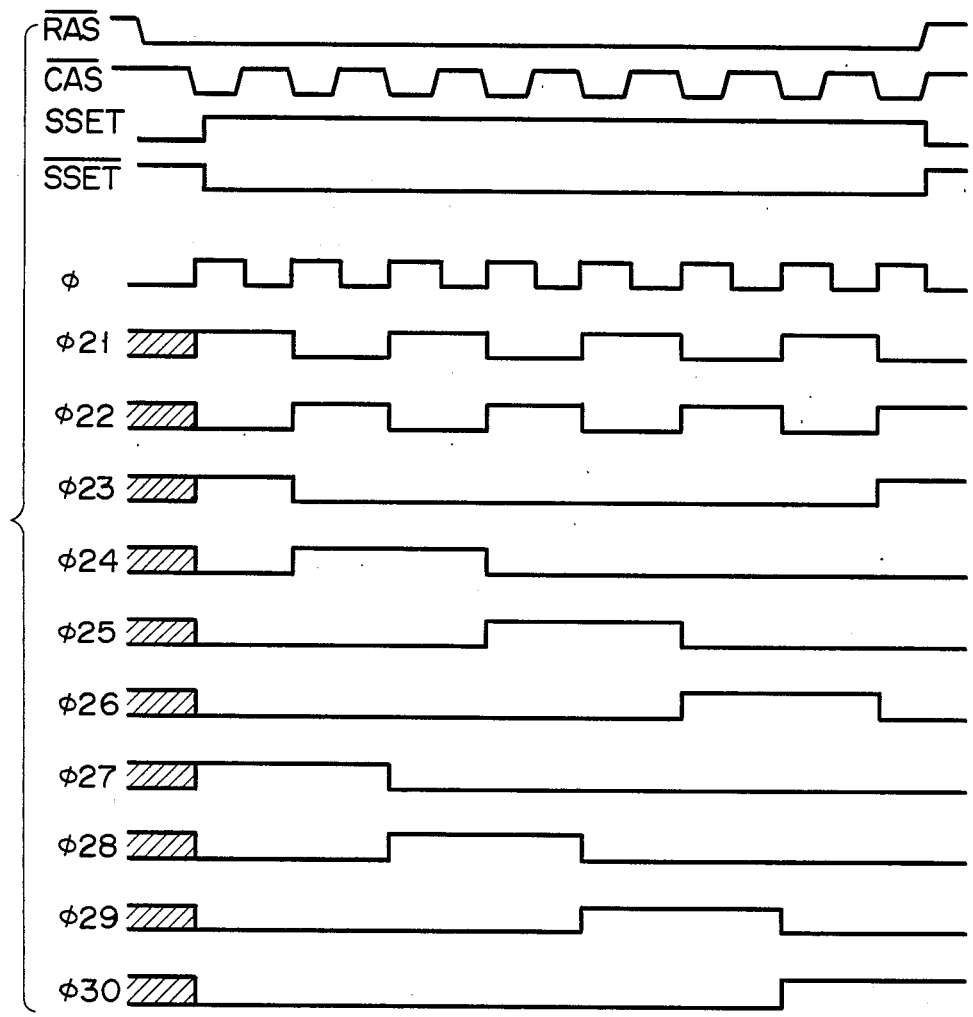
F I G. 14A

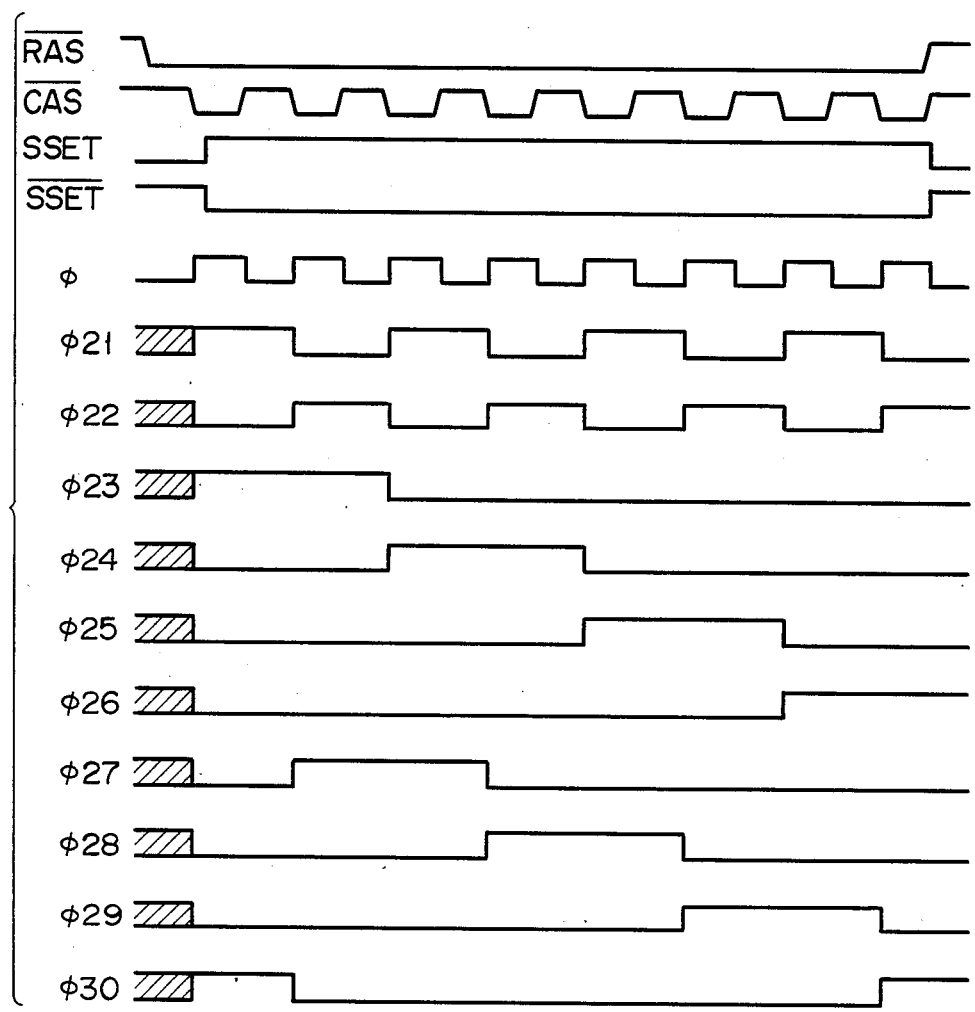
F I G. 15

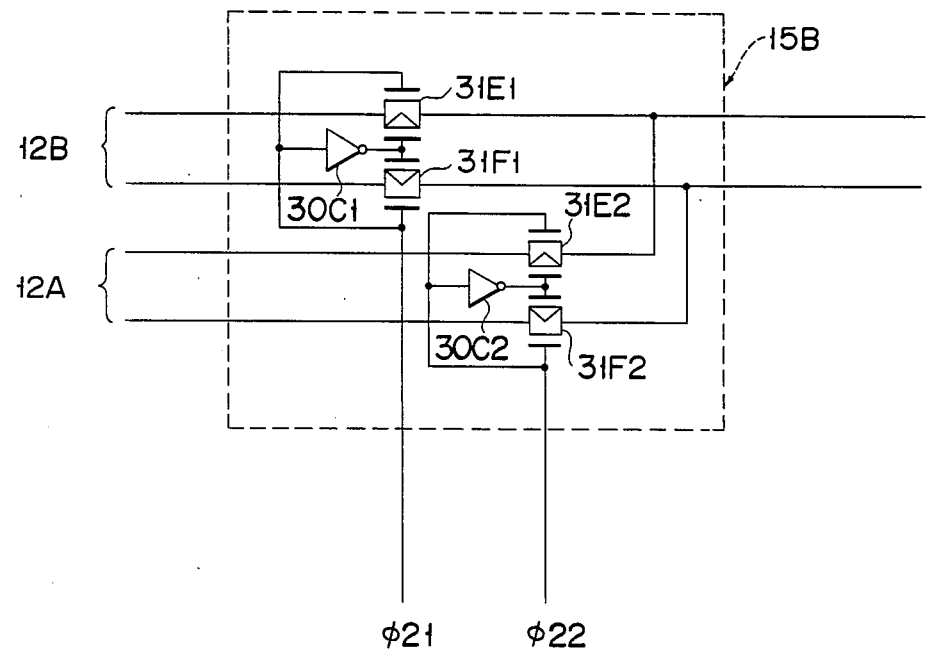
F I G. 16

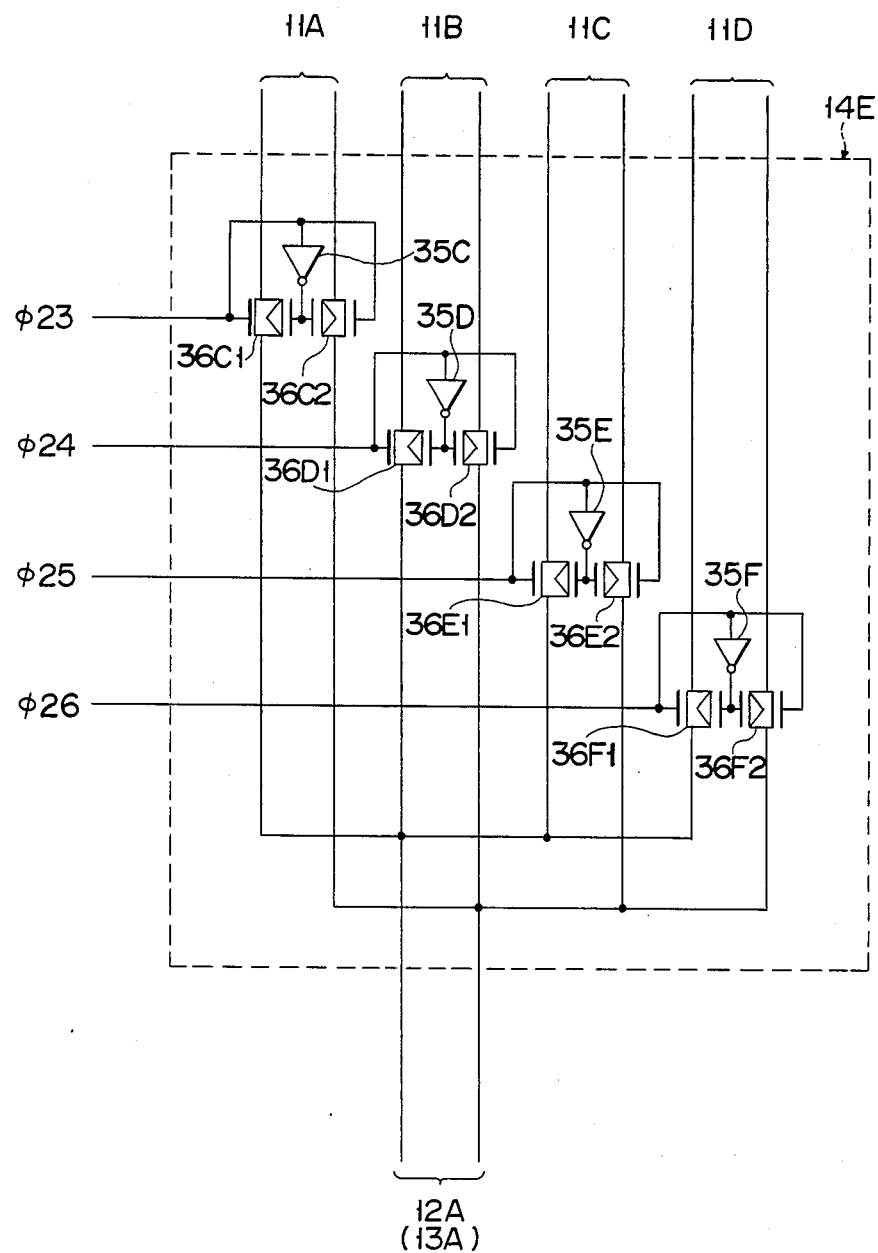
F I G. 17

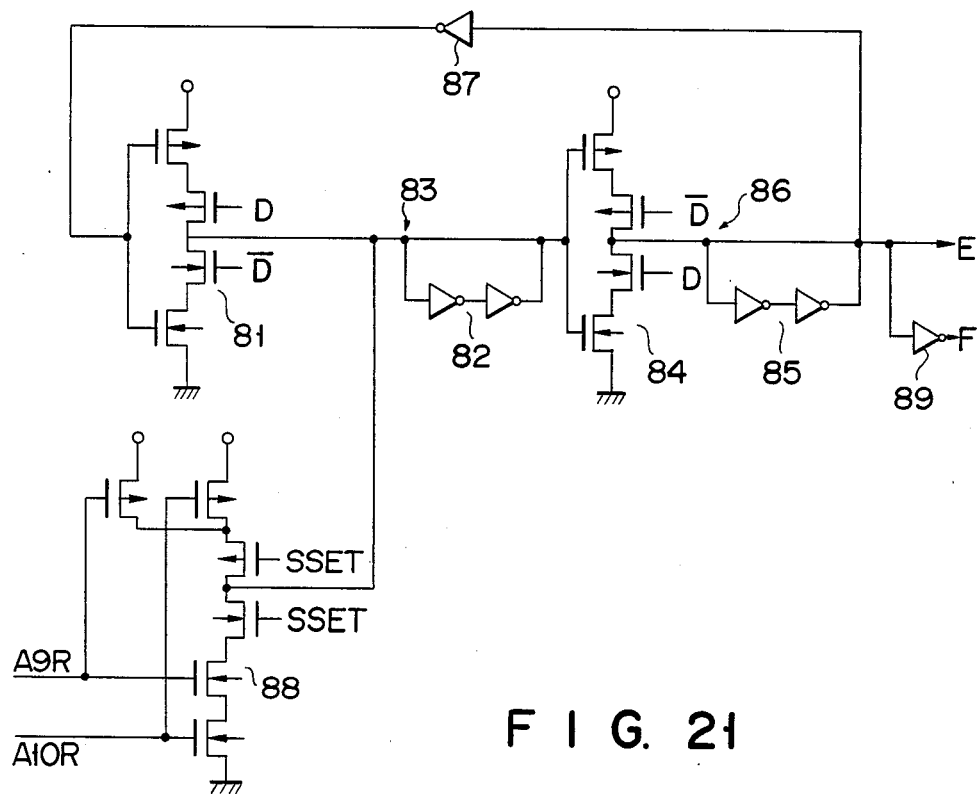
F I G. 21
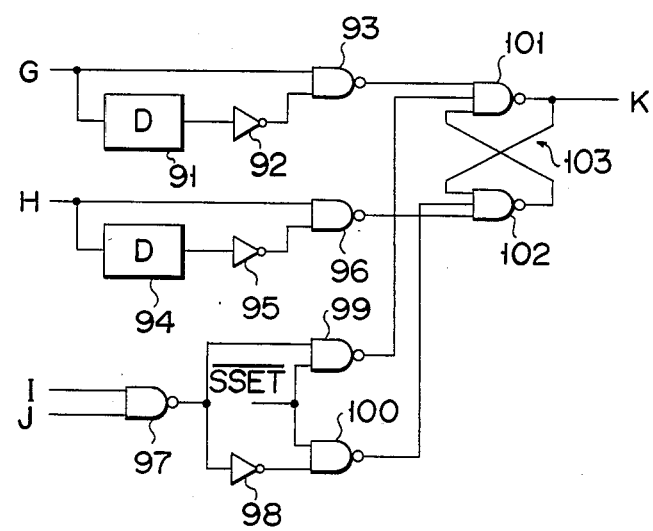
F I G. 22

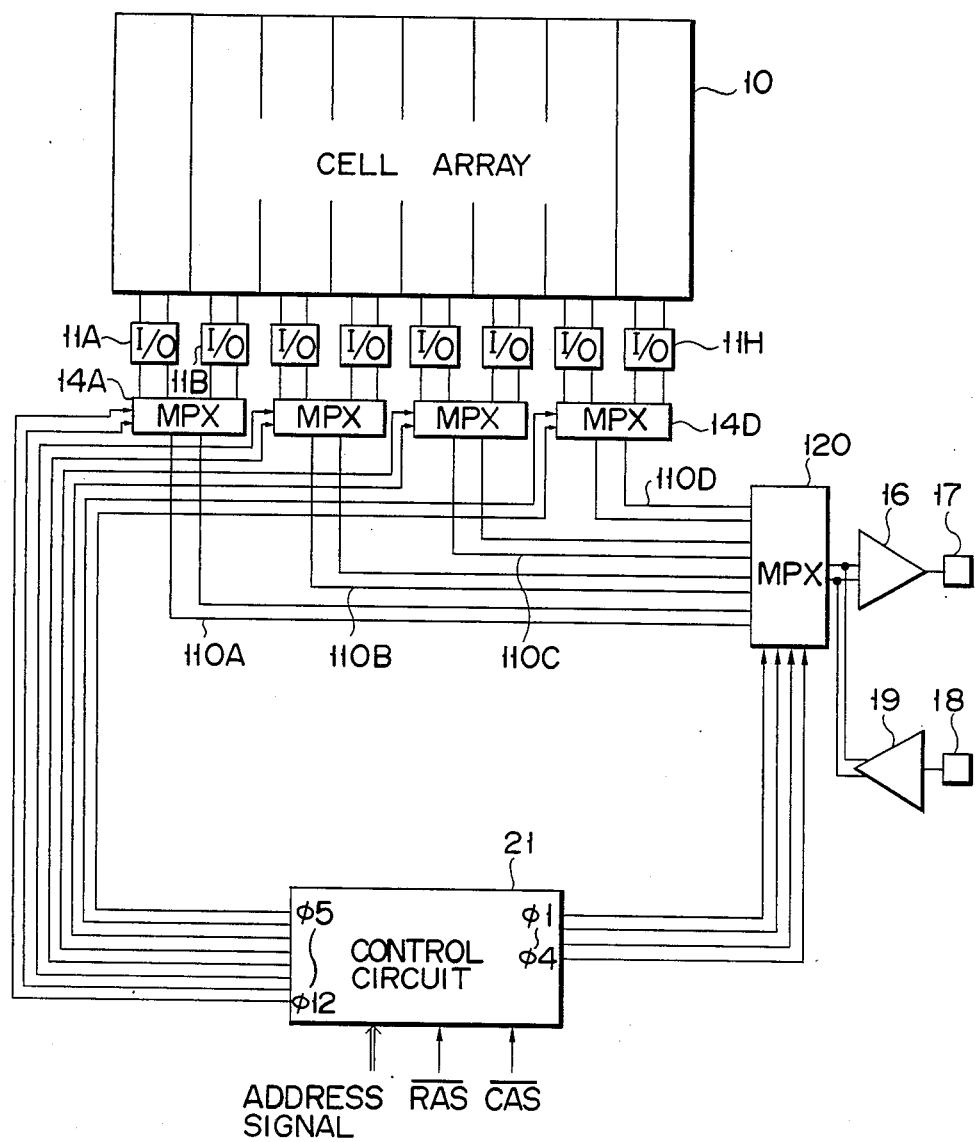
F I G. 23

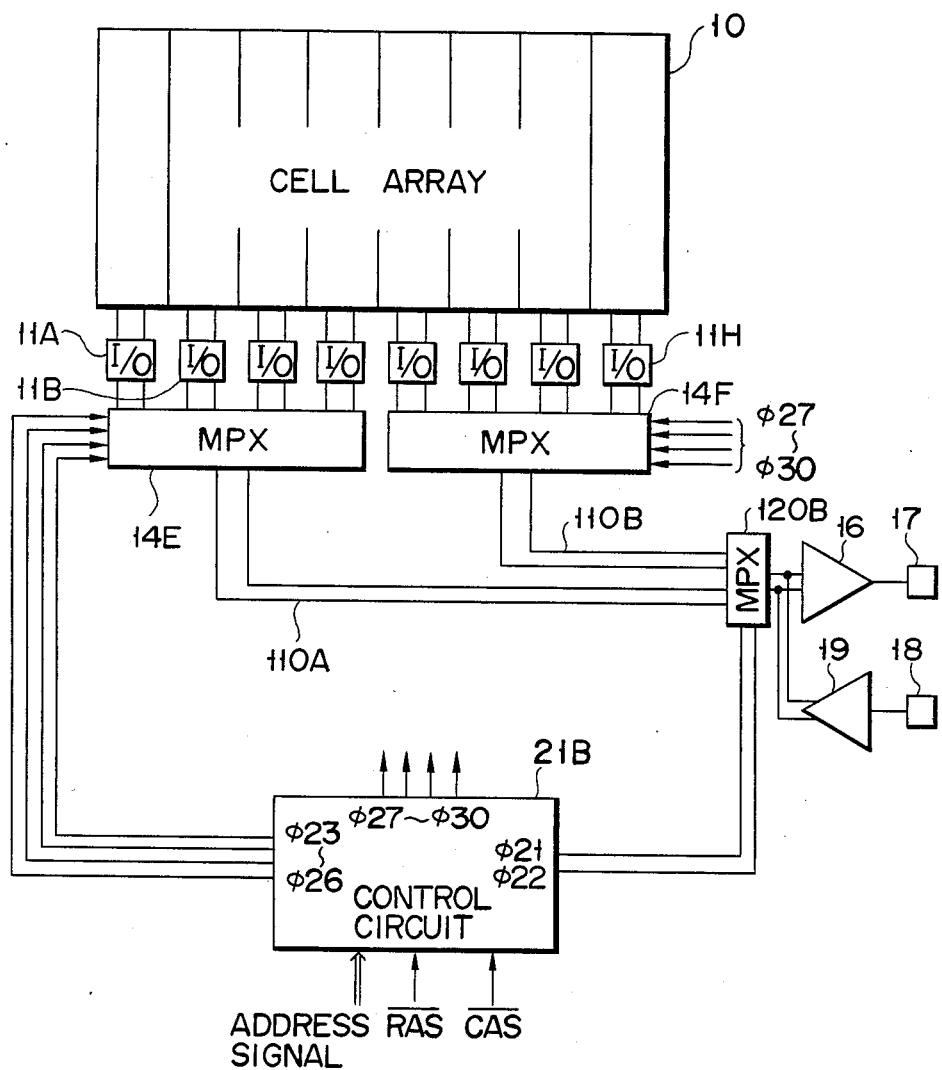
F I G. 24

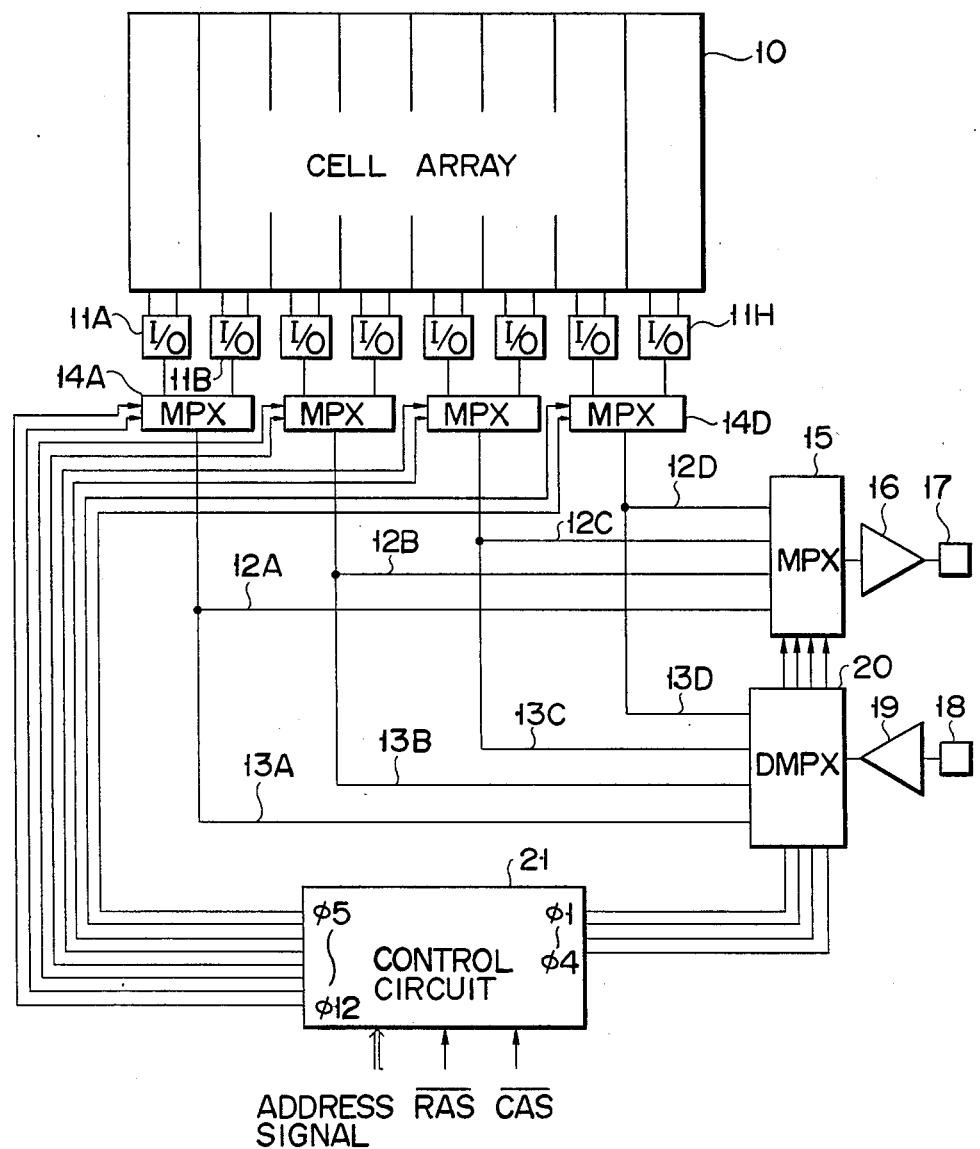
F I G. 25

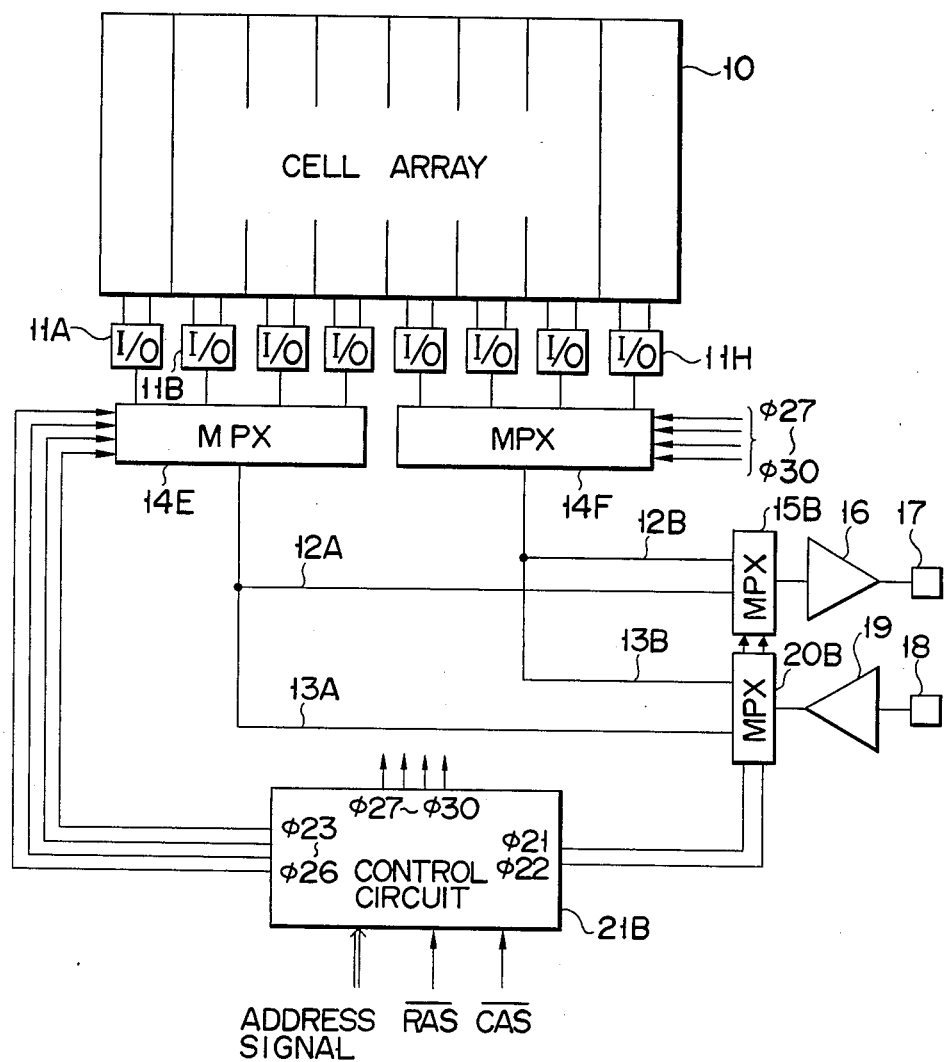
F I G. 26

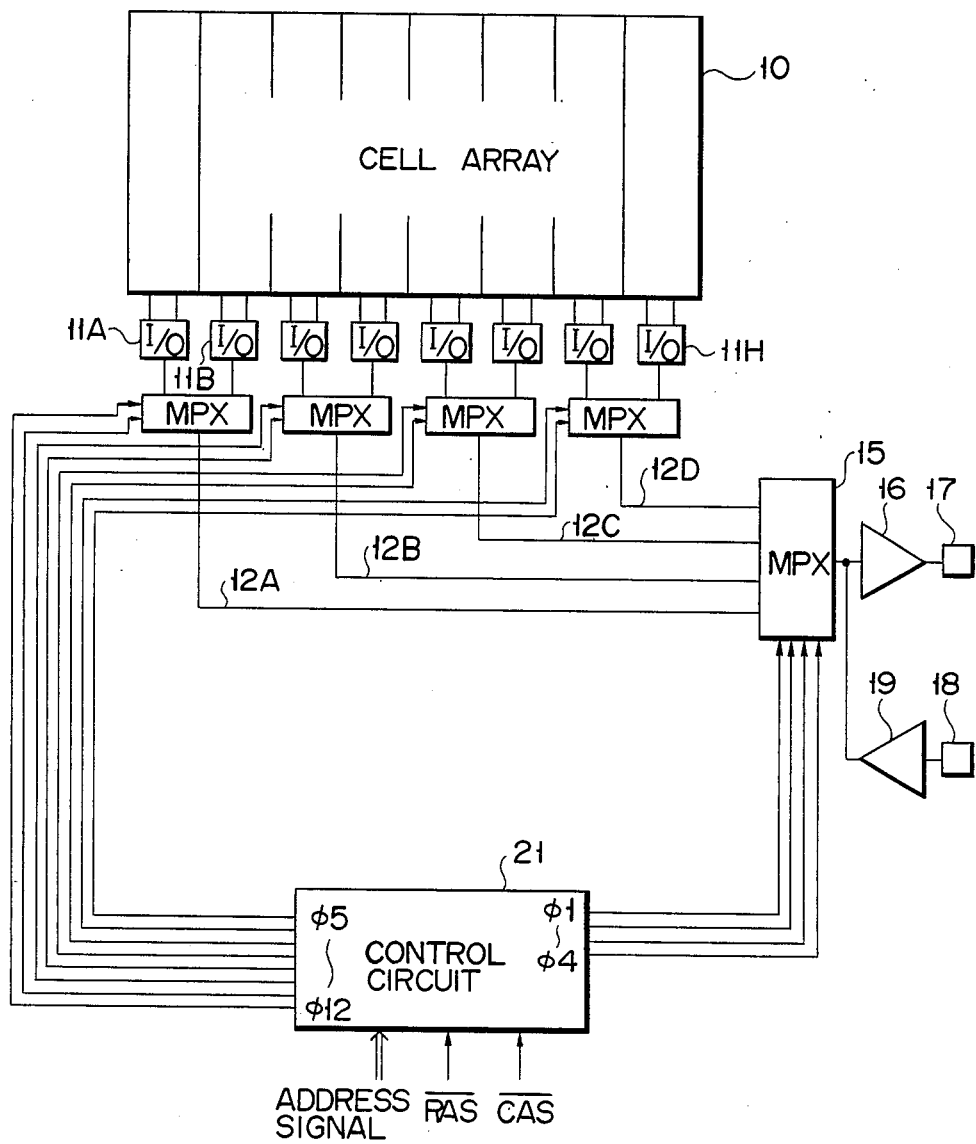
F I G. 27

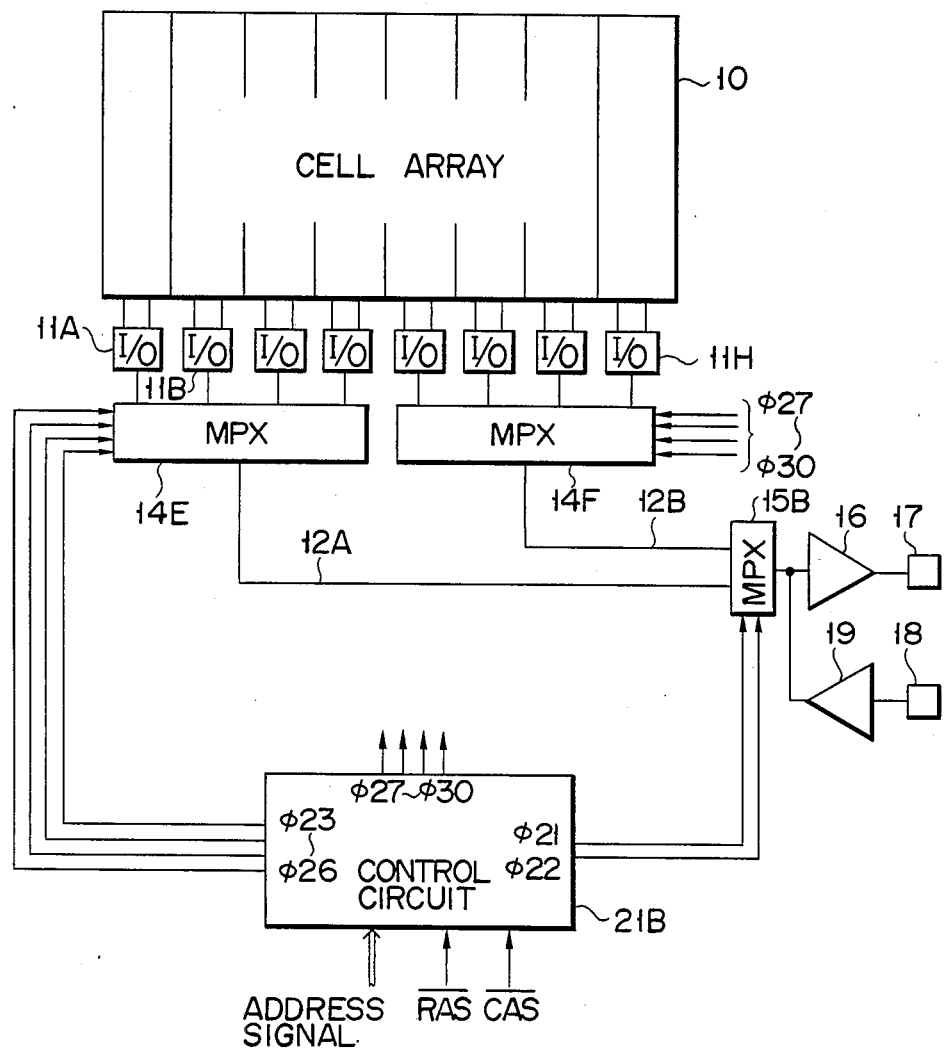
F I G. 28

SEMICONDUCTOR MEMORY DEVICE

BACKGROUND OF THE INVENTION

This invention relates to a highspeed semiconductor memory device capable of performing serial data access in a nibble or byte mode.

Conventionally, in a high speed dynamic type semiconductor memory device (which is hereinafter referred to as a DRAM), n pairs of data bus lines for data input and data output are provided in order to transfer n-bit serial data. That is, n-bit data is first stored in a buffer circuit provided near a data output circuit, and data is sequentially read out from the buffer circuit, in response to an output signal from in n-bit shift register, and then supplied outwardly via a data output circuit. Further, in another type of prior art DRAM, only a single pair of data bus lines are provided for each of data input and data output in this case, n bit data read out from a cell array having a plurality of divided sections are previously stored in n buffer circuits which are arranged along the data bus lines at a position far away from a data output circuit. The buffer circuits are sequentially coupled to the data bus lines in response to an output signal from an n-bit shift register, thus permitting output data from the buffer circuits to be supplied via the data output circuit.

In the data write-in mode of types of DRAM, data is transferred via the data circuit in a direction opposite to that in the data readout mode, and is stored in the n buffer circuits in the same manner as in the data readout mode.

FIGS. 1 and 2 are block diagrams of the prior art DRAMs performing data access in the case of n=8, i.e. in the byte mode.

FIG. 1 shows an example of a DRAM in which a total of 16 pairs of data bus lines including 8 pairs of data bus lines 151 for data input and 8 pairs of data bus lines 152 for data output are provided and cell array 153 is divided into eight blocks. At the time o access, it is possible to independently access one bit for each block. Thus, eight bits can be accessed as a whole. Input/output buffers 154 are connected to cell array 153, and output data selection multiplexer 155 serves to sequentially select data on 8 pairs of output data bus lines 151 at the time of data readout. Data selected by output data selection multiplexer 155 is supplied to output driver 156 which in turn supplies the data outwardly via data output pad 157. Data supplied to data input pad 158 is fed to input data selection multiplexer 160 via input driver 159. Input data selection multiplexer 160 serves to selectively and sequentially transfer data from input driver 159 to 8 pairs of input data bus lines 152, in the data write-in mode. 8-bit shift register 161 generates, in response to a basic clock signal $\phi$, clock signals which are used to control the selection operations of output data selection multiplexer 155 and input data selection multiplexer 160.

FIG. 2 shows an example of a DRAM in which two pairs of data buses 171 and 172 are provided each for data input and data output and cell array 173 is divided into eight blocks, as in the case of FIG. 1. Input/ output buffers 174 are respectively connected to the eight blocks of cell array 173. Output driver 175 supplies data outwardly via data output pad 176. Data supplied to data input pad 17 is fed to input driver 178. Input/output buffer selection multiplexer 179 selectively and sequentially transfers data from eight input/output buffers 174 to output data bus 171, in the data readout mode, and sequentially transfers data on input data bus 172 to eight input/output buffers 174, in the data write-in mode. 8-bit shift register 180 generates, in response to the basic clock signal $\phi$, clock signals which are used to control the selection operation of input/output buffer selection multiplexer 174.

In the DRAM shown in FIG. 1, output data is selected at a stage located immediately before output driver 156, in the data readout mode, and input data is selected at a stage located immediately after input driver 159, in the data write-in mode. In this way, high speed read-out operation and write-in operation can be attained. However, a large number of data bus lines are required; in this example, as many as 16 pairs of data bus lines are needed. Even if data bus lines are commonly used for data input and data output, this still necessitates the provision of eight pairs of data bus lines. For this reason, it is necessary to provide a large wiring area around the memory cell array for circuit integration, thereby increasing the chip area.

In contrast, in the DRAM shown in FIG. 2, input/output data is selected at a stage near I/O buffers 174, and therefore, only two pairs of data bus lines are required in this example. Further, if data bus lines are commonly used for data input and data output, it is then only necessary to use one pair of data bus lines. As a result, an increase in chip area for circuit integration can be avoided, in the case of this DRAM. However, since data selection is effected at a stage far away from the input/output driver, data which is transferred via the long data bus lines will be delayed, making it difficult to attain high speed data readout and data write-in operations. Thus, in the prior art memory device capable of effecting serial access, it is not possible to reduce the chip area for circuit integration and at the same time enhance the operation speed for data readout and write-in.

SUMMARY OF THE INVENTION

An object of this invention is to provide a semiconductor memory device capable of effecting serial access, and in which the chip area is made small, and high speed operation can be attained.

The above object can be achieved by a semiconductor memory device comprising at least one memory cell array having N memory blocks; N buffers divided into n groups and respectively connected to the memory blocks; a plurality of buffer selection circuits respectively connected to n groups of buffers; one or more data selection circuits; a driver circuit connected to the data selection circuit; a plurality of data buses each connected between a corresponding one of the buffer selection circuits and the data selection circuit; and a control unit for supplying control signals to the data and buffer selection circuits in each operation cycle, to selectively connect one of the n buffer circuits to a corresponding one of the data buses via a corresponding one of the buffer selection circuits, and at the same time sequentially connect the data buses to the driver circuit via the data selection circuit, thus transferring serial data with respect to the memory cell array via the data buses.

In this invention, the buffer and data selection circuits are respectively connected to the input/output buffer circuits and the input/output driver circuit, and data of a plurality of bits is transferred between the buffer and driver circuits via one of the data buses in a time sharing fashion. This makes it possible to reduce the chip area and attain high speed operation.

BRIEF DESCRIPTION OF THE DRAWINGS

FIG. 3 is a circuit diagram of a DRAM according to one embodiment of this invention;

FIGS. 4 to 6 signal waveform diagrams illustrating the operation of the DRAM shown in FIG. 3;

FIG. 9 is a circuit diagram of a buffer selection multiplexer shown in FIG. 3;

FIG. 10 is a circuit diagram of part of a control signal generating circuit shown in FIG. 3 for generating clock signals $\phi 1$ to $\phi 4$;

FIG. 11 is a circuit diagram of a clock generator shown in FIG. 10;

FIG. 12 is a circuit diagram of part of the control signal generating circuit shown in FIG. 3 for generating clock signals $\phi 5$ to $\phi 12$;

FIG. 13 is a circuit diagram of a DRAM according to another embodiment of this invention;

FIGS. 14A, 14B and 15 are signal waveform diagrams illustrating the operation of the DRAM shown in FIG. 13;

FIG. 16 is a circuit diagram of a data selection multiplexer shown in FIG. 13;

FIG. 17 is a circuit diagram of a buffer selection multiplexer shown in FIG. 13;

FIGS. 20 to 22 are circuit diagrams of circuit sections of the control signal generating circuit shown in FIG. 13 for generating clock signals $\phi 23$ to $\phi 30$; and FIGS. 23 to 29 are circuit diagrams of DRAMs according to other embodiments of this invention.

DETAILED DESCRIPTION OF THE PREFERRED EMBODIMENTS

Figure 1:
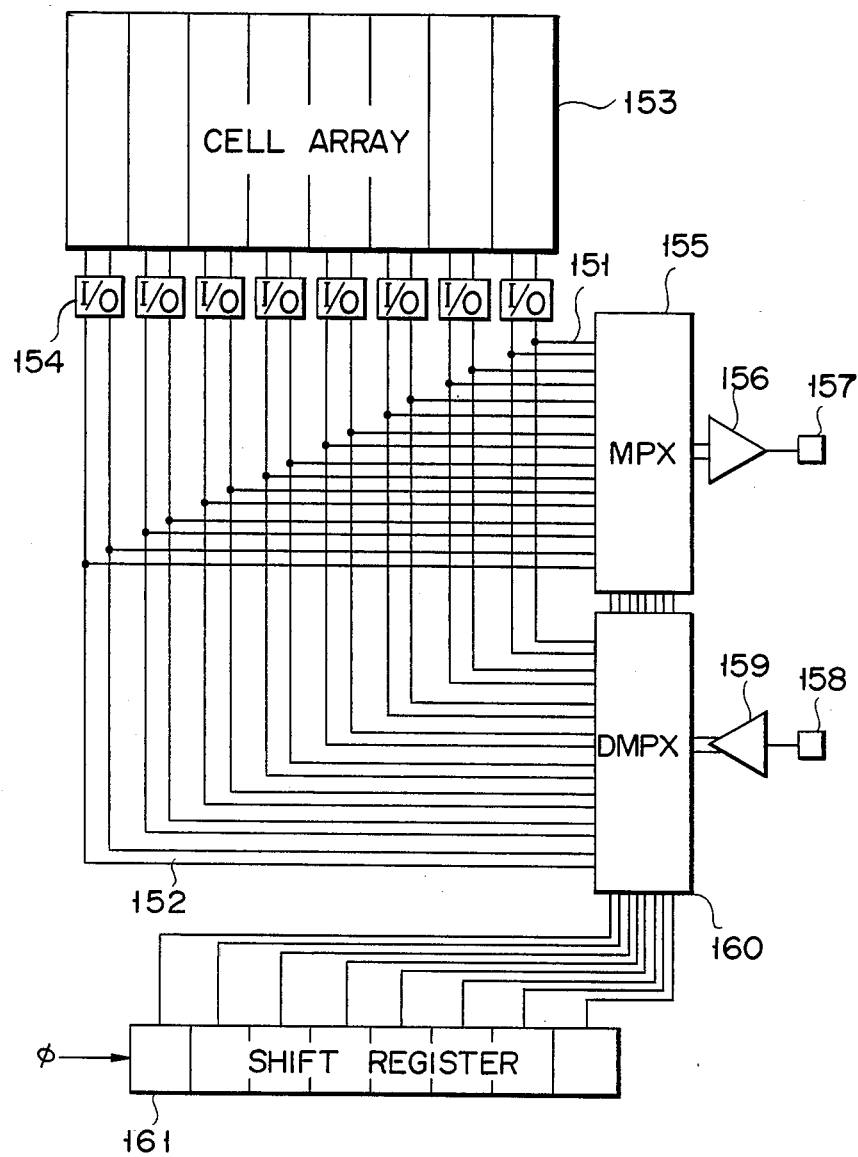
FIG. 1 is a circuit diagram of the prior art DRAM having data selection multiplexers.
Figure 2:
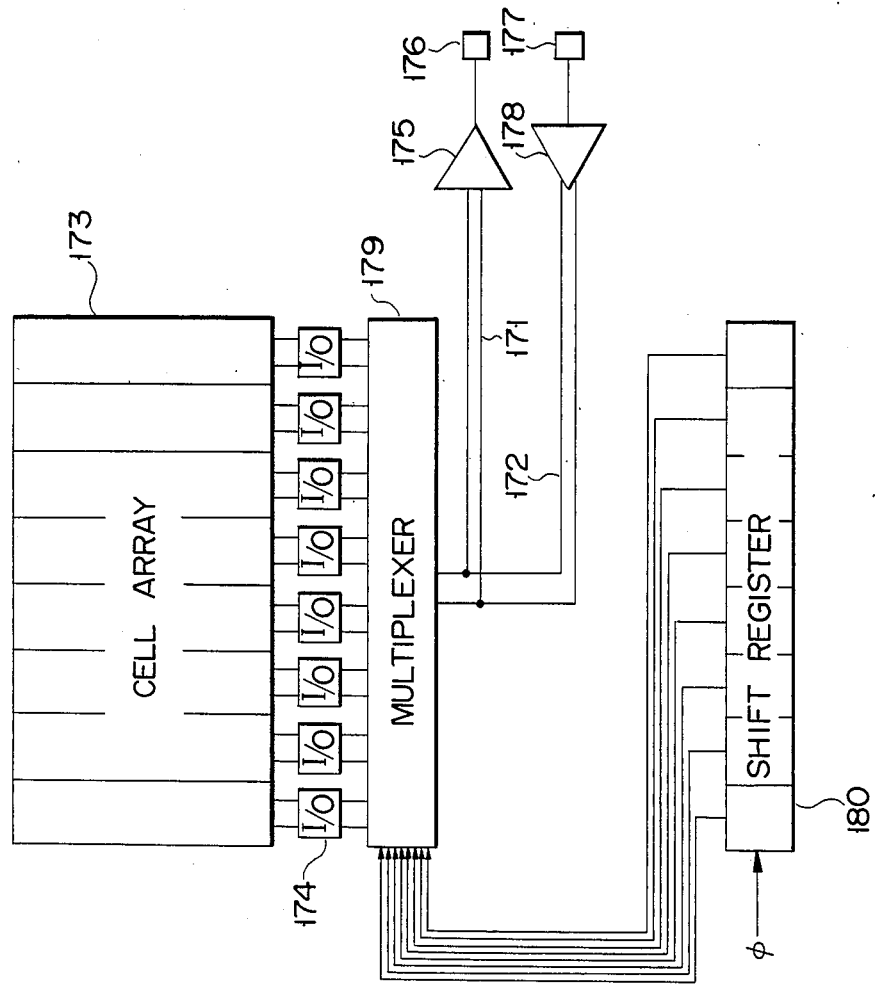
FIG. 2 is a circuit diagram of the prior art DRAM having a buffer selection multiplexer.

There will now be describe embodiments of this invention with reference to the drawing.

FIG. 3 is a circuit diagram of a dynamic type semiconductor memory device (DRAM) according to a first embodiment of this invention. The DRAM has a 4M-bit memory capacity and performs serial data access in a 8-bit serial mode.

The DRAM includes cell array 10 having 4M-bit dynamic memory cells (not shown) divided into eight blocks. In cell array 10, 1-bit data is read out from each block based on an input address signal (row and column addresses) at the time of access. Thus, 4-bit data is read out in parallel as a whole. The DRAM further includes I/O buffers 11A to 11H to which data to be written into or read out from cell array 10 is supplied, four readout data buses 12A to 12D each formed of a pair of data lines for transmitting complementary data, and four write-in data buses 13A and 13D each formed of a pair of data lines. I/O buffer selection multiplexers 14A to 14D are provided each of which is connected to control corresponding two of I/O buffers 11A to 11H in response to clock signals $\phi 5$, $\phi 6$; $\phi 7$, $\phi 8$; $\phi 9$, $\phi 10$; and $\phi 11$, $\phi 12$. That is, in the data readout mode, data from two of I/O buffers 11A to 11H are sequentially selected and supplied to a corresponding one of readout data buses 12A to 12D, and in the data write-in mode, data on one of write-in data buses 13A to 13D is sequentially supplied to corresponding two I/O buffers 11A to 11H. Output data selection multiplexer 15 sequentially selects data on four data buses 12A to 12D in response to clock signals $\phi 1$ to $\phi 4$ and outputs the selected data bit by bit. Data selected by output data selection multiplexer 15 is supplied to data output pad 17 via output driver 16. Data supplied to data input pad 18 is fed to input data selection demultiplexer 20 via input driver 19. Input data selection demultiplexer (DMPX) 20 selectively and sequentially supplies data from input driver 19 to four write-in data buses 13 in response to clock signals $\phi 1$ to $\phi 4$ from control circuit 21 which generates clock signals $\phi 1$ to $\phi 12$.

Control circuit 21 is connected to receive row address strobe signal $\overline{RAS}$, column address strobe signal $\overline{CAS}$, and row and column address signals to generate clock signals $\phi 1$ to $\phi 12$ depending on write-in mode, readout mode or write-in/readout mode. Control circuit 21 includes row address buffer 21-1 for generating signals A10R, $\overline{A10R}$, A9R and $\overline{A9R}$ in response to a row address signal and row address strobe signal $\overline{RAS}$; column address buffer 21-2 for generating signals A10C, $\overline{A10C}$, SSET and $\overline{SSET}$ in response to a column address signal and column address strobe signal $\overline{CAS}$; basic clock generator 21-3 $\phi$ and $\overline{\phi}$ in response to column address strobe signal $\overline{CAS}$; and clock signal generator 21-4 for generating clock signals $\phi 1$ to $\phi 12$ in response to output signals from buffers 21-1, 21-2 and clock generator 21-3. Signal SSET is made active when a shift register is set based on the head address for serial access.

Next, the serial operation in the byte mode in the above described DRAM is explained. FIG. 4 is a timing chart illustrating the data readout operation in the byte mode. First, a predetermined row address signal is supplied to an address input pad (not shown) in response to the fall of an externally supplied row address strobe signal $\overline{RAS}$. Then, the head address signal of a column address to be read out in the byte mode is supplied to the address input pad in response to the initial fall of an externally supplied column address strobe signal $\overline{CAS}$. According to the address specified by row address and column head address signal, 8-bit data is read out from cell array 10 via the sense amplifier. Eight bits of the readout data are respectively supplied to I/O buffers 11A to 11H in parallel. In contrast, in a state prior to the initial fall of column address strobe signal $\overline{CAS}$, control signal SSET is set at "0" level. At this time, the internal state of control circuit 21 is unconditionally determined. Then, control circuit 21 generates a basic clock signal $\phi$ in synchronism with signal $\overline{CAS}$, and sequentially produces clock signals $\phi 1$ to $\phi 12$ at timings shown in FIG. 4.

Prior to time t1 in FIG. 4, the levels of clock signals $\phi 1$ to $\phi 12$ are not definite. In FIG. 4, the regions are hatched. When time t1 is reached, block signal $\phi 1$ to rises to "1" level. At this time, clock signals $\phi 5$, $\phi 7$, clock signal $\phi 1$ are each set at "1" level. When block signal $\phi 5$, $\phi 7$, $\phi 9$ and $\phi 11$ are set at "1" level, data from I/O buffers 11A, 11C, 11E and 11G which are each one of the paired I/O buffers are selected by I/O buffer selection multiplexers 14A to 14D, respectively, and are supplied as complementary bit data to respective readout data buses 12A to 12D. Further, when clock signal $\phi 1$ is at "1" level, data on data bus 12A is selected by output data selection multiplexer 15. Therefore, in a period of one cycle of basic clock signal $\phi$ from time t1, data from I/O buffer 11A is output a first bit data via output driver 16 and data output pad 17.

At time t2, clock signal $\phi 1$ is set to "0" level and block signal $\phi 2$ rises to "1" level. When clock signal $\phi 2$ at "1" level, data on data bus 12B is selected by output data selection multiplexer 15. Therefore, in period of one cycle of basic clock signal $\phi$ from time t2, data from I/O buffer 11C is output as second bit data via driver 16 and data output pad 17.

In the same manner as described above, data from I/O buffer 11E is selected and output as third bit data in a period of one cycle of basic clock signal $\phi$ from time t3, and data from I/O buffer 11G is selected and output as fourth bit data in a period of one cycle of basic clock signal $\phi$ from time t4 by output data selection multiplexer 15. Thus, after time t4, data from I/O buffers 11A, 11C, 11E and 11G are derived.

At time t2 after a period of one cycle of basic clock signal $\phi$ has elapsed time t1 and data from I/O buffer 11A has been selected by output data selection multiplexer, clock signal $\phi 5$ becomes "0" level, and clock signal $\phi 6$ rises to "1" level. Unlike the former case, when clock signal $\phi 6$ is at "1" level, data from I/O buffer 11B is selected by output buffer selection multiplexer 14A, and the selected data is supplied as paired or complementary data to data bus 12A. The paired or complementary data on data bus 12A is selected by output data selection multiplexer 15 at time t5 which is delayed by a period of three cycles of clock signal $\phi$ with respect to time t2 and output as fifth bit data in synchronism with clock signal $\phi 1$.

Similarly, at time t3 after a period of one cycle of basic clock signal $\phi$ has elapsed from time t2 and data from I/O buffer 11C has been selected by output buffer selection multiplexer 15, clock signal $\phi 7$ is set to "0" level and clock signal $\phi 8$ rises to "1" level. Unlike the former case, data from I/O buffer 11D is selected by I/O buffer selection multiplexer 14 when clock signal $\phi 8$ is at "1" level. The selected data is supplied as paired or complementary data to data bus 12B. The paired data on data bus 12B is selected by output data selection multiplexer 15 at time t6 which is delayed by a period of three cycles of clock signal $\phi$ with respect to time t3 and output as sixth bit data in synchronism with clock signal $\phi 2$.

In the same manner as described above, clock signal $\phi 9$ becomes "0" level and $\phi 10$ rises to "1" level at time t4, and clock signal $\phi 11$ becomes "0" level and clock signal $\phi 12$ rises to "1" level at time t5. At times t7 and t8 which are delayed by a period of three cycles of clock signal $\phi$ with respect to times t4 and t5, respectively, output data from I/O buffers 11F and 11H are selected by output data selection multiplexer 15 and output as seventh and eighth bit data in synchronism with clock signals $\phi 3$, and $\phi 4$. Therefore, data from I/O buffers 11B, 11D, 11F and 11H are output after time t8.

In the DRAM of the above embodiment, data can be read out in the byte mode. It is only necessary to provide eight data buses in total including four readout data buses and four write-in data buses. That is, the number of data buses is reduced to one half that used in the prior art case shown in FIG. 1. This permits the wiring area for circuit integration to be reduced to one half that required in the FIG. 1 circuit, thereby decreasing the chip area. Thus, data on data bus 12A to 12D is selectively output by output data selection multiplexer 15 in synchronism with clock signals $\phi 1$ to $\phi 4$. In this case, for example, the data has been supplied to data bus 12B from I/O buffer selection multiplexer 14B a period of three cycles (3T) prior to the data selection by output data selection multiplexer 15, as shown by, for example, clock signal $\phi 8$. That is, an allocated time interval from data selection by selection multiplexer 14B until the selected data is transferred to and temporarily latched in the input stage of selection multiplexer 15 is set sufficiently long (3T). Therefore, data selected by selection multiplexer 14B can be stably transferred to selection multiplexer 15 within the allocated time. Owing to this, time delay caused when data is transferred via the long data bus will not affect the high speed serial access operation. That is, a high speed data readout operation can be effected.

FIG. 5 is a timing chart illustrating an example of the data write-in operation in the byte mode. In this case, the basic operation is the same as in the readout mode. However, the data transferring direction in the data write-in operation is opposite to that in the data readout operation, and therefore, clock signals $\phi 5$ to $\phi 12$ are generated from control circuit 21 at timings different from those in the case of FIG. 4.

Data on write-in data buses 13A to 13D can be selected by I/O buffer selection multiplexers 14A to 14D in synchronism with clock signals $\phi 5$ to $\phi 12$. In this case, since I/O buffer selection multiplexer 14B is operated during a period of four cycles 4T after the write-in selection by selection demultiplexer 20 as shown by, for example, clock signal $\phi 7$, a sufficiently long time can be provided for data selected by selection demultiplexer 20 to be transferred to selection multiplexer 14B via write-in data bus 13B and temporarily latched in the input stage of selection multiplexer 14B. This prevents time delay occurring in the data transfer via the long data bus from affecting the high speed serial access operation. That is, data can be written at a high speed.

Figure 6:
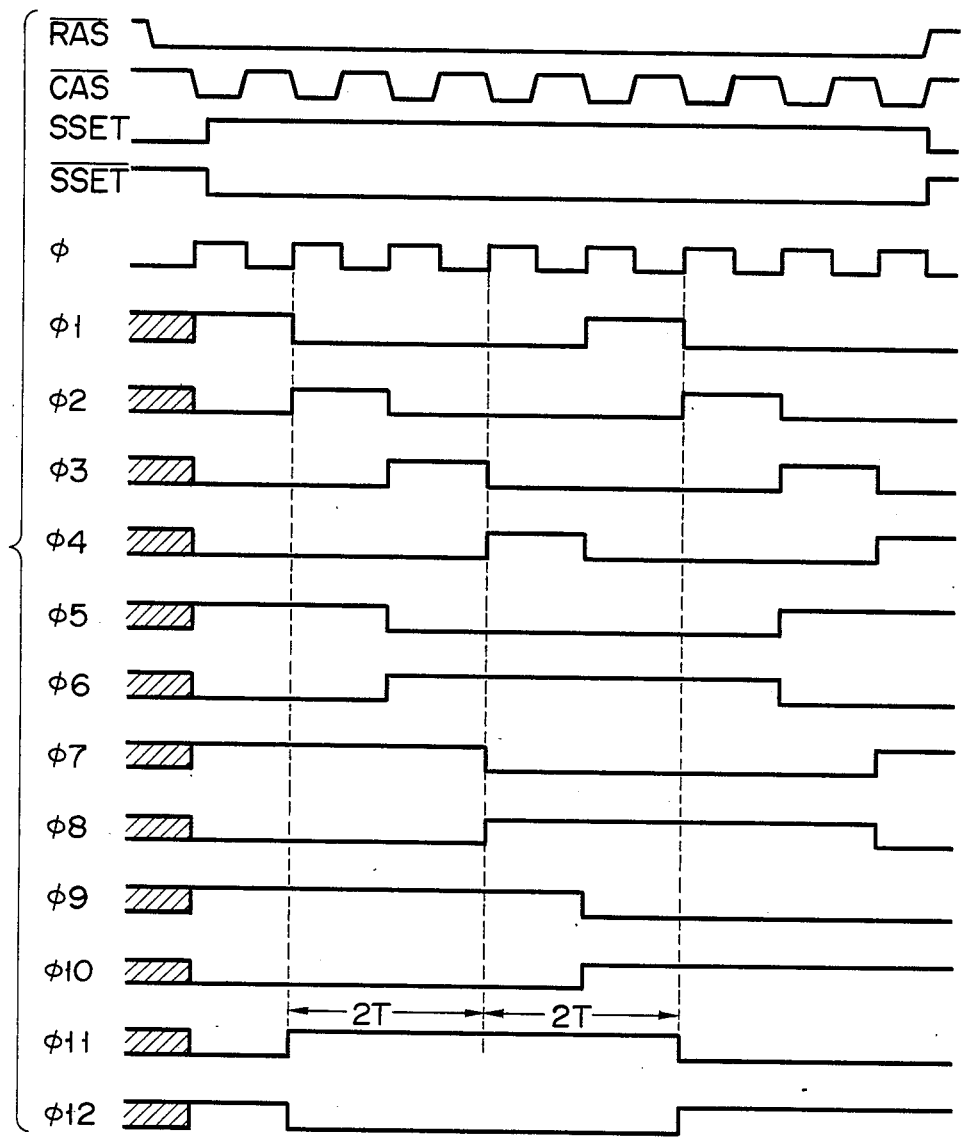

In general, in serial accessible DRAMs, data write-in and readout operations can be effected in a period of sequential serial access operations. In such a case, control circuit 21 may be designed to generate clock signals $\phi 5$ to $\phi 12$ at timings shown by a timing chart of FIG. 6. According to the timing chart, data from the I/O buffer has been selected and supplied to the readout data bus a period of two cycles (2T) before the data on the readout data bus is selected by output data selection multiplexer 15 in the data readout operation. In contrast, in the data write-in operation, write-in data has been supplied from input data selection demultiplexer 20 to the write-in data bus a period of two cycles (2T) before the data on the write-in data bus is selected by the I/O buffer selection multiplexer in the data write-in operation. Thus, a period of two cycles can be provided for data to be transferred via the data bus in each of the data write-in and readout operations. Also, in this case, time delay occurring in the data transfer via the long data bus will not affect the high speed serial access operation.

Figure 7:
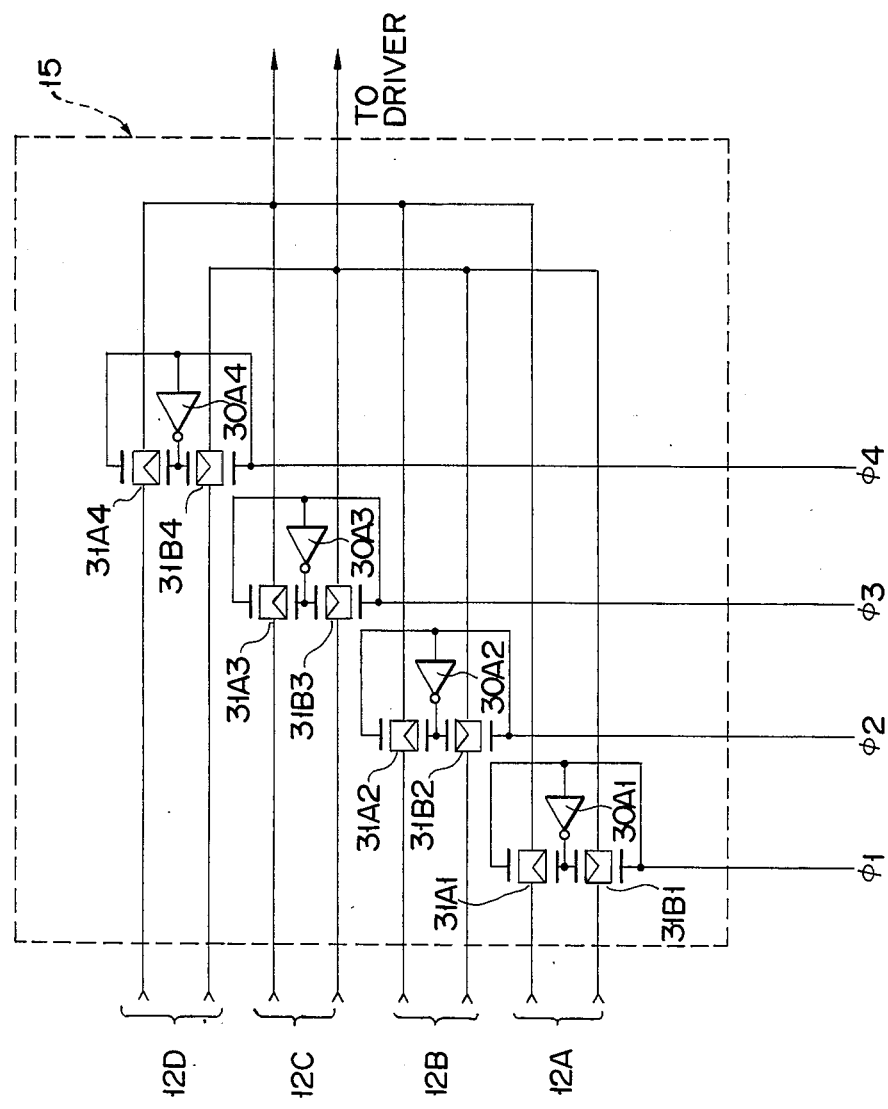
FIG. 7 is a circuit diagram of a data selection multiplexer shown in FIG. 3.

FIG. 7 is a circuit diagram showing the detailed construction of output data selection multiplexer 15 in the above embodiment. As shown in FIG. 7, selection multiplexer 15 includes inverters 30A1 to 30A4 for inverting clock signals $\phi 1$ to $\phi 4$ and paired CMOS transfer gates 31A1 to 31A4 and 31B1 to 31B4 which are connected to four readout data buses 12A to 12D each having a pair of data lines and whose conduction states are controlled by clock signals $\phi 1$ to $\phi 4$ and signals obtained by inverting the clock signals by inverters 30A1 to 30A4. One end of each of the CMOS gates is commonly connected at the input side of output driver 16. Only that pair of CMOS transfer gates which receive clock signals at "1" level can be rendered conductive, thereby activating a pair of data bus lines of data bus 12A, 12B, 12C or 12D connected to the pair of conductive CMOS transfer gates.

Figure 8:
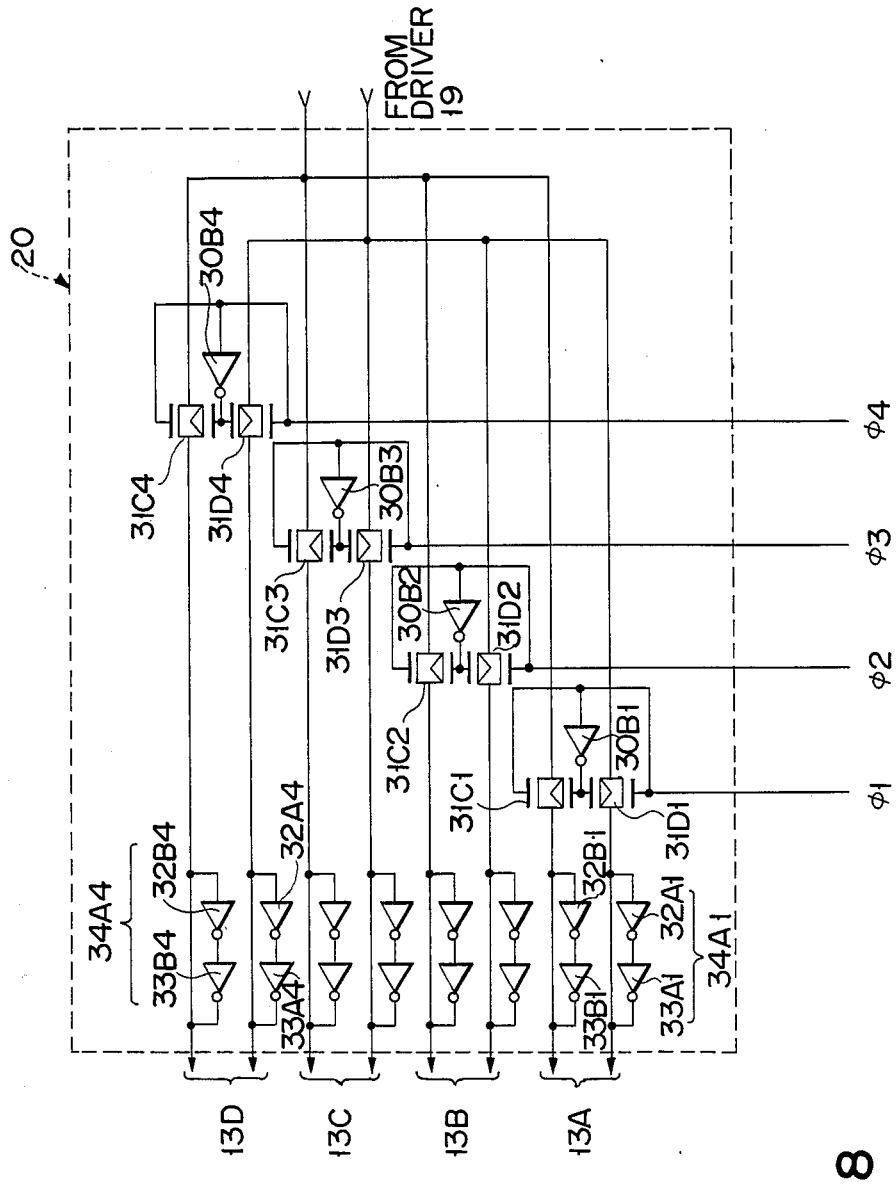
FIG. 8 is a circuit diagram of a data selection demultiplexer shown in FIG. 3.

FIG. 8 is a circuit diagram showing the detail construction of input data selection demultiplexer 20 in the above embodiment. Similar to output data selection multiplexer 15, input data selection demultiplexer 20 includes inverters 30B1 to 30B4 for inverting clock signals $\phi 1$ to $\phi 4$ and paired CMOS transfer gates 31C1 to 31C4 and 31D1 to 31D4 which are connected to four writein data buses 13A to 13D each having a pair of data lines and whose conduction states are controlled by clock signals $\phi 1$ to $\phi 4$ and signals obtained by inverting the clock signals by inverters 30A1 to 30A4. In addition, it includes terminator circuits 34A1 to 34A4 each constituted by two inverters 32A1 to 32A4 and 33A1 to 33A4. Only that pair of CMOS transfer gates which receive clock signals at "1" level can be rendered conductive, thereby activating a pair of data bus lines of data bus 13A, 13B, 13C or 13D connected to the pair of conductive CMOS transfer gates.

FIG. 9 is a circuit diagram showing the detail construction of I/O buffer selection multiplexer 14A used in the above embodiment. The construction and operation of other selection multiplexers 14B to 14D are similar to those of selection multiplexer 14A. As shown in FIG. 9, selection multiplexer 14A includes inverters 35A and 35B for inverting clock signals $\phi 5$ and $\phi 6$ and paired CMOS transfer gates 36A1 and 36A2 and 36B1 and 36B2 which are connected to two pairs of I/O data lines of I/O buffers 11A and 11B and whose conduction states are controlled by clock signals $\phi 5$ and $\phi 6$ and signals obtained by inverting the clock signals by inverters 35A and 35B. Only that pair of CMOS transfer gates which receive clock signals at "1" level can be rendered conductive, thereby activating I/O buffer 11A or 11B connected to the pair of conductive CMOS transfer gates.

FIG. 10 is a circuit diagram showing the detail construction of a circuit section which is part of control circuit 21 of the above embodiment for and serves to generate clock signals $\phi 1$ to $\phi 4$. The circuit section includes four serially connected clock signal generating circuits 40A to 40D, output clock signal from clock signal generating circuit 40D at the fourth stage being fed back to first stage clock signal generating circuit 40A. Each of the clock signal generating circuits is supplied with basic clock signal $\phi$ and inverted basic clock signal $\bar{\phi}$ which are generated in control circuit 21 in synchronism with column address strobe signal $\overline{CAS}$, control signal SSET and inverted control signal $\overline{SSET}$. Further, first stage clock signal generating circuit 40A is supplied with inverted address signals $\overline{A1DR}$ and $\overline{A10C}$ of the most significant bits of 11-bit row addresses A0R to A10R and 11-bit column addresses A0C to A10C. Also, second, third and fourth stage clock signal generating circuits 40B, 40C and 40D are respectively supplied with signals A10R and $\overline{A10C}$; and A10C; and $\overline{A10R}$ and A10C. When signals SSET and $\overline{SSET}$ are respectively at "0" and "1" levels in this circuit, only output clock signal $\phi 1$ from first stage clock signal generating circuit 40A receiving signals $\overline{A10R}$ and $\overline{A10C}$ is set to "1" level, and clock signals $\phi 2$ to $\phi 4$ from other clock signal generating circuits are all set to "0" level in the case when A10R=A10C=0. Thereafter, "1" level signal is sequentially transferred to the latter stage in response to basic clock signal $\phi$ to generate clock signals $\phi 1$ to $\phi 4$ as shown in timing charts of FIGS. 4 to 6.

FIG. 11 is a circuit diagram showing the detail construction of clock signal generating circuit 40A in the circuit of FIG. 10. Clock signal generating circuit 40A includes half-bit shifting circuit 4 for shifting signal $\phi 4$ from the preceding stage by a period corresponding to half a bit of signal $\phi$, half-bit shifting circuit 46 for shifting the output signal from shifting circuit 46 by a half bit of signal clocked NAND circuit 47. Shifting circuit 43 includes a clocked inverter 41 for inverting signal $\phi 4$ in synchronism with clock signal $\phi$ and terminator circuit 42 connected to receive an output signal from inverter 41. Shift circuit 46 includes clocked inverter 44 for inverting an output signal from shifting circuit 43 and terminator circuit 45 connected to receive an output signal from inverter 44. NAND circuit 47 is set operative only when control signal SSET is at "0" level, and produces an output signal to terminator circuit 42 in response to address signal and $\overline{A10R}$ and $\overline{A10C}$. In first stage clock signal generating circuit 40A, NAND circuit 47 produces an output signal of "0" level if address signals $\overline{A10R}$ and $\overline{A10C}$ are set to "1" level when control signals SSET and $\overline{SSET}$ are at "0" and "1" levels, respectively, and the output signal of "0" level is supplied to terminator circuit 42 of shifting circuit 43. Thereafter, when basic clock signal $\phi$ rises to "1" level to activate shifting circuit 46, output clock signal $\phi 1$ therefrom becomes "1" level. In this case, either one of input address signals supplied to NAND circuit 47 is at "0" level in each of the clock signal generating circuits 40B to 40D except the first stage so that an output signal from each NAND circuit 47 becomes "1" level. Owing to this, when basic clock signal $\phi$ rises to "1" level, each shifting circuit 46 is set operative to produce an output clock signal of "0" level. Further, after signal SSET is set to "1" level, NAND circuit 47 in each of the clock signal generating circuits is made inoperative. Then, "1" level state is transferred to clock signal generating circuit 40 at the succeeding stage in synchronism with basic clock signal $\phi$. Clock signal generating circuits 40B to 40D are constructed and operated in the same manner as clock signal generating circuit 40A.

FIG. 12 is a circuit diagram showing the detailed construction of a circuit section of control circuit 21 in the above embodiment which generates clock signals $\phi 5$ $\phi 12$. Total of four circuits having the same circuit construction are provided. That is, the circuit section includes half-bit shifting circuit 53 for shifting an input signal by a period corresponding to half a bit of signal A, half-bit shifting circuit 56 for shifting an output signal from shifting circuit 53 by a half bit of signal $\bar{A}$, inverter 57 for feeding back an output signal from shifting circuit 56 to an input terminal of shifting circuit 53, clocked inverter 58 and inverter 59 for inverting an output signal of shifting circuit 56. Shifting circuit 53 includes clocked inverter 51 for inverting an input signal in synchronism with signal A and terminator circuit 52 connected to receive an output signal from inverter 51. Shift circuit 56 includes clocked inverter 54 for inverting an output signal from shifting circuit 53 in synchronism with signal $\overline{A}$ and terminator circuit 55 connected to receive an output signal from inverter 54. Inverter 58 is connected to receive row address signal A9R, invert an input signal in response to control signal SSET and supply an output signal to terminator circuit 52 of shifting circuit 53. In a case where clock signals $\phi 5$ to $\phi 12$ are generated at data readout timings in the serial mode of the FIG. 12 circuit, signals $\phi 1$ to $\phi 4$ are supplied to four respective circuits as input signal A as shown in Table 1.

TABLE 1

| A | $\phi 1$ | $\phi 2$ | $\phi 3$ | $\phi 4$ |
|---|---|---|---|---|
| $\phi i$ | $\phi 5$ | $\phi 7$ | $\phi 9$ | $\phi 11$ |
| $\phi i + 1$ | $\phi 6$ | $\phi 8$ | $\phi 10$ | $\phi 12$ |

As is clearly seen from Table 1, output signals $\phi 5$, $\phi 7$, $\phi 9$ and $\phi 11$ are supplied as an output signal $\phi i$ from respective shifting circuits 46, and signals $\phi 6$, $\phi 8$, $\phi 10$ and $\phi 12$ are supplied as an output signal $\phi (i+1)$ from respective inverters 59. Further, Table 2 shows a case where clock signals $\phi 5$ to $\phi 12$ are generated at data write-in timings in the serial mode, and Table 3 shows a case where clock signals $\phi 5$ to $\phi 12$ are generated at data read/write timings in the serial mode.

TABLE 2

| A | $\phi 1$ | $\phi 2$ | $\phi 3$ | $\phi 4$ |
|---|---|---|---|---|
| $\phi i$ | $\phi 7$ | $\phi 9$ | $\phi 11$ | $\phi 5$ |
| $\phi i + 1$ | $\phi 8$ | $\phi 10$ | $\phi 12$ | $\phi 6$ |

TABLE 3

| A | $\phi 1$ | $\phi 2$ | $\phi 3$ | $\phi 4$ |
|---|---|---|---|---|
| $\phi i$ | $\phi 11$ | $\phi 5$ | $\phi 7$ | $\phi 9$ |
| $\phi i + 1$ | $\phi 12$ | $\phi 6$ | $\phi 8$ | $\phi 10$ |

FIG. 13 is a circuit diagram of a DRAM according to a second embodiment of this invention which performs byte mode access and has a 4 M-bit memory capacity similar to the embodiment of FIG. 3. The DRAM includes cell array 10 divided into eight blocks, I/O buffers 11A to 11H for temporarily storing readout data supplied from or write-in data to cell array 10, two readout data buses 12A and 12B each having a pair of data lines, two write-in data buses 13A and 13B each having a pair of data lines, I/O buffer selection multiplexers 14E and 14F which are each connected to corresponding four I/O buffers 11A to 11D; or 11E to 11H, output data selection multiplexer 15B, output driver 16 connected to receive data selected by output data selection multiplexer 15B, data output pad 16, data input pad 18, input driver 19, input data selection multiplexer 20B and control circuit 21B for generating clock signals $\phi 21$ to $\phi 30$. Each of I/O buffer selection multiplexers 14E and 14F sequentially selects from the corresponding four I/O buffers 11A to 11D; or 11E to 11H and supplies the selected data to corresponding readout data bus 12A or 12B in the data readout mode, and sequentially transfers data on corresponding write-in data bus 13A or 13B to the corresponding four I/O buffers 11A to 11D; or 11E to 11H in the data write-in mode. Output data selection multiplexer 15B selects data on two data buses 12A and 12B according to clock signals $\phi 21$ and $\phi 22$ to generate data bit by bit, and I/O data selection multiplexer 20B selectively supplies data from input driver 19 to one of two data buses 13A and 13B according to clock signals $\phi 21$ and $\phi 22$ in the data write-in modes.

Similar to the embodiment of FIG. 3, control circuit 21 is connected to receive row address strobe signal $\overline{RAS}$, column address strobe signal $\overline{CAS}$ and row and column address signals and generating clock signals $\phi 21$ and $\phi 22$ according to these input signals and a state signal indicating data readout operation, data write-in operation or data write-in/readout operation.

In a DRAM of this embodiment, since delay time caused when transferring data on data buses 12A, 12B and 13A, 13B is relatively short as compared with a case of the embodiment shown in FIG. 3, it is not necessary to pay much attention to the time difference between clock signals $\phi 23$ to $\phi 30$ for controlling I/O buffer selection for controlling output data selection multiplexer 15B or input data selection demultiplexer 20B.

Figure 14B:
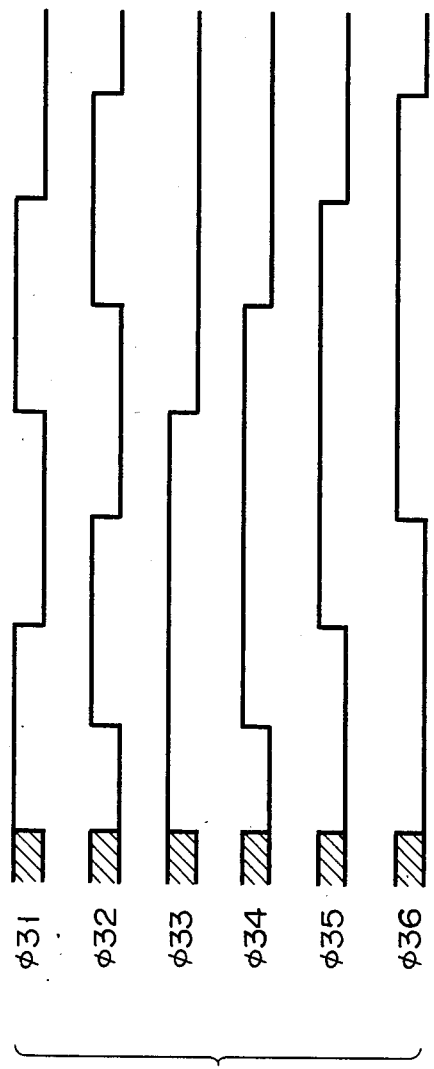

FIGS. 14A and 14B show a timing chart illustrating the data readout or data read/write operation in the byte mode, and FIG. 15 is a timing chart illustrating an example of data write-in operation in the byte mode.

The basic operation of the DRAM in this embodiment is substantially the same as that in FIG. 3 embodiment. In this embodiment, each of I/O buffer selection multiplexers 14E and 14F sequentially selects one of four I/O buffers 11A to 11D; or 11E to 11H. Four I/O buffers 11A to 11D; or 11E to 11H are sequentially selected to supply output data to readout data bus 12A to 12B in the data readout operation, and data on write-in data bus 13A or 13B is selectively supplied to I/O buffers 11A to 11D; or 11E to 11H in the data write-in operation. Thus, also in the DRAM of this embodiment, data readout, write-in or read/write operation can be performed in the byte mode. Further, in this case, it is only necessary to use a total number of four data buses, two data readout buses and two data write-in buses, and therefore, the wiring area in this embodiment can be reduced to one half that of the FIG. 3 embodiment.

In the data readout or read/write operation shown by the timing chart of FIGS. 14A and 14B, a period of two cycles of basic clock signal $\phi$ is provided to transfer data selected by selection multiplexer 14E or 14F to output data selection multiplexer 15B via data bus 12A or 12B, or to transfer data selected by input data selection multiplexer 20B to selection multiplexer 14E or 14F via data bus 13A or 13B. Therefore, time delay occurring when transferring data via the long data bus will not affect the high speed serial operation. That is, a high speed data readout operation or read/write operation can be achieved. Further, in the data write-in operation shown by the timing chart of FIG. 15, a period of four cycles of basic clock signal $\phi$ is allocated, thereby attaining a high speed data writein operation.

FIG. 16 is a circuit diagram showing the detailed construction of output data selection multiplexer 15B in the above embodiment. As is shown in FIG. 16, selection multiplexer 15B includes inverters 30Cl and 30C2 for inverting clock signals $\phi 21$ and $\phi 22$, and paired CMOS transfer gates 31El and 31Fl; and 31E2 and 31F2 respectively connected to two readout data buses 12B and 12A. The conduction states of the CMOS transfer gates are controlled by clock signals $\phi 21$ and $\phi 22$ and signals obtained by inverting the clock signals by inverters 30Cl and 30C2. Output data selection multiplexer 15B is similar to selection multiplexer 15 of FIG. 7 except that the number of transfer gates used is reduced with reduction in the number of data buses. Further, input data selection multiplexer 20B of this embodiment is similar to selection multiplexer 20 shown in FIG. 8 except that inverters, CMOS transfer gates and latch circuits are provided to correspond in number to the data buses.

FIG. 17 is a circuit diagram showing the detailed construction of I/O buffer selection multiplexer 14E in this embodiment. The selection multiplexer includes inverters 35C to 35F, and four pairs of CMOS transfer gates 36C1, 36C2; 36D1, 36D2; 36E1, 36E2; and 36F1, 36F2 respectively connected to I/O buffers 11A to 11D. The conduction states of the CMOS transfer gates are controlled by clock signals $\phi 23$ to $\phi 26$ and inverted signals obtained by inverting the clock signals by inverters 35C to 35F. In this case, I/O buffer selection multiplexer 14F is similar to selection multiplexer 14 of FIG. 9 except that the number of inverters and CMOS transfer gates is increased with increase in the number of I/O buffers connected thereto so as to select four I/O buffers 11A to 11D.

Figure 18:
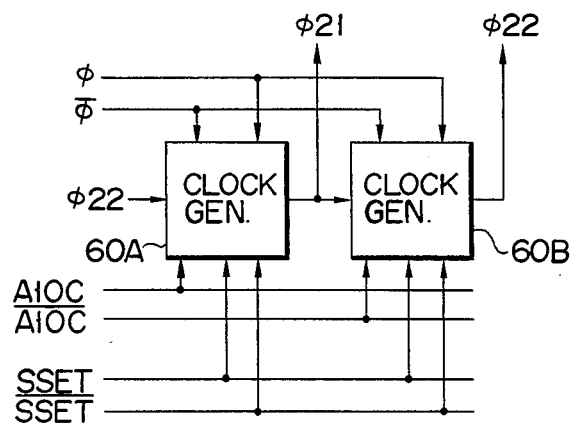
FIG. 18 is a circuit diagram of part of a control signal generating circuit shown in FIG. 13 for generating clock signals $\phi 21$ and $\phi 22$.

FIG. 18 showing the detailed construction of that circuit section of control circuit 21B of this embodiment which generates clock signals $\phi 21$ and $\phi 22$. In this circuit section, two clock signal generating circuits 60A and 60B of the same construction are serially connected output clock signal $\phi 22$ from clock signal generating circuit 60B at the latter stage being fed back to clock signal generating circuit 60A at the preceding stage. Each of clock signal generating circuits 60A and 60B is connected to receive basic clock signal $\phi$ and an inverted signal $\bar{\phi}$ thereof which are generated in synchronism with column address strobe signal $\overline{CAS}$, and control signals SSET and inverted signal $\overline{SSET}$ thereof. Clock signal generating circuit 60A at the preceding stage is connected to receive the most significant bit address A10C of 11-bit column addresses A0C to A10C, and clock signal generating circuit 60B at the latter stage is connected to receive the inverted address signal $\overline{A1-C}$ bit address A10C. When control signals SSET and $\overline{SSET}$ are respectively at "0" and "1" levels, preceding stage clock signal generating circuit 60A which receives address A10C supplies output clock signal $\phi 21$ at "1" level, causing output signal $\phi 22$ from latter stage clock signal generating circuit 60B to be set to "0" level if A10C="1". Then, "1" level signal is transferred to the latter stage circuit 60B in synchronism with basic clock signal $\phi$, thus generating clock signals $\phi 21$ and $\phi 22$ as shown by the timing charts in FIGS. 14A, 14B and 15.

Figure 19:
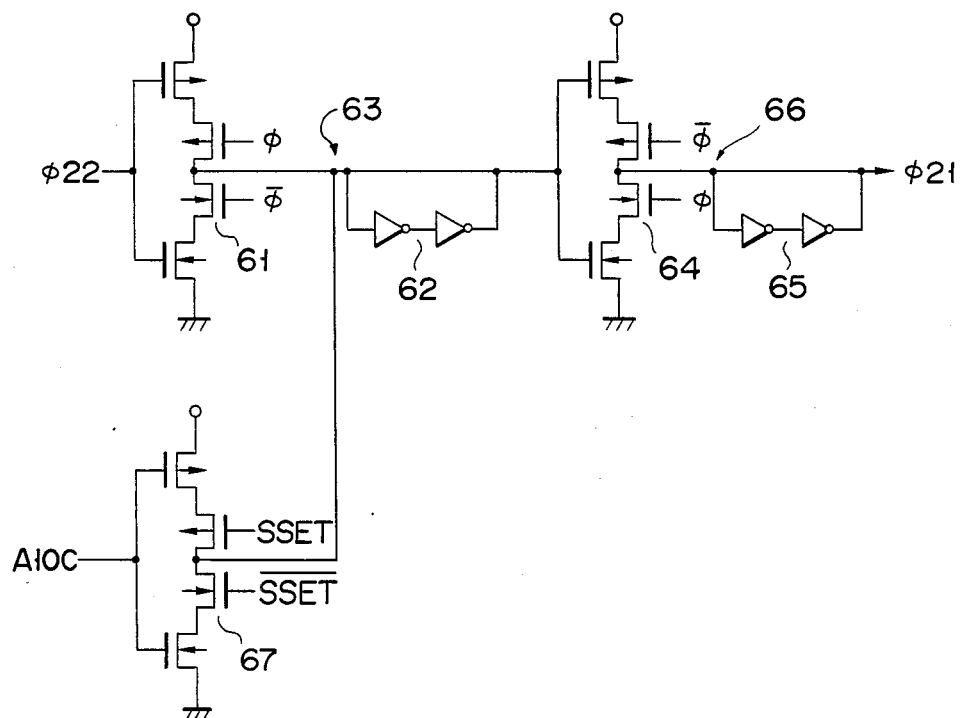
FIG. 19 is a circuit diagram of a block generator shown in FIG. 18.

FIG. 19 is a circuit diagram showing the detailed construction of clock signal generating circuit 60A in the FIG. 18 circuit. The circuit includes half bit shifting circuit 63 of shifting clock signal $\phi 22$ by a half bit of signal half bit shifting circuit 66 for shifting an output signal from shifting circuit 63 by a half bit of signal $\phi$, and clocked inverter 67. Shifting circuit 63 includes clocked inverter 61 for inverting signal $\phi 22$ in synchronism with clock signal $\phi$ and terminator circuit 62 connected to receive an output signal of inverter 61, and shifting circuit 66 includes clocked inverter circuit 64 for inverting an output signal of shifting circuit 63 and terminator circuit 65 connected to receive an output signal of inverter 64. Clocked inverter 67 is set operative only when control signal SSET is at "0" level, and supplies an output signal to terminator 62 of shifting circuit 63 in response to address signal A10C or $\overline{A10C}$. Assume that address signal A10C supplied to clock signal generating circuit 60A is set to "1" level when control signals SSET and $\overline{SSET}$ are respectively at "0" and "1" levels. Then, clocked inverter 67 generates an output signal of "0" level which is in turn supplied to terminator circuit 62 of shifting circuit 63. Thereafter, when basic clock signal $\phi$ rises to "1" level, shift circuit 66 is activated to generate output clock signal $\phi 21$ of "1" level. In this case, in latter stage clock signal generating circuit 60B, address signal $\overline{A10C}$ supplied to clocked inverter 67 is at "0" level and an output signal of inverter 67 is kept at "1" level. If, in this condition, basic clock signal $\phi$ rises to "1" level to activate shifting circuit 66, output clock signal $\phi 22$ is set to "0" level. After signal SSET rises to "1" level, clocked inverter 67 of each of clock signal generating circuits 60A and 60B is set inoperative, and then "1" level state is transferred to latter stage clock signal generating circuit 60B in response to basic clock signal $\phi$.

Figure 20:
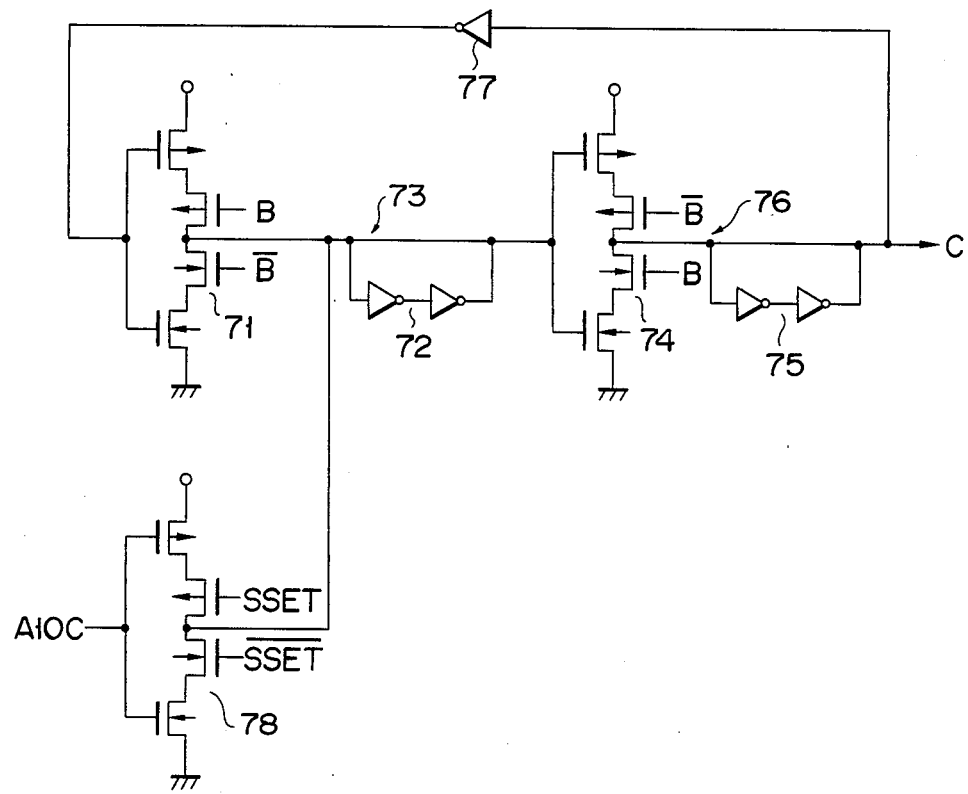

FIGS. 20 to 22 are circuit diagrams showing the detailed construction of circuit sections provided in control circuit 21B of this embodiment to produce clock signals $\phi 23$ to $\phi 30$. In control circuit 21B, two circuits with the circuit construction of FIG. 20, four circuits with the circuit construction of FIG. 21, and eight circuits with the circuit construction of FIG. 22 are provided.

The circuit of FIG. 20 includes half bit shifting circuit 73 for shifting input signal by a half bit of signal $\bar{B}$, half bit shifting circuit 76 for shifting an output signal from shifting circuit 73 by a half bit of signal B, inverter 77 for feeding an output signal of shifting circuit 76 back to shifting circuit 73 as an input signal, and clocked inverter 78. Shifting circuit 73 includes clocked inverter 71 for inverting an input signal in synchronism with signal $\bar{B}$ and terminator circuit 72 connected to receive an output signal of inverter 71, and shifting circuit 76 includes clocked inverter circuit 74 for inverting an output signal of shifting circuit 73 in synchronism with signal B and terminator circuit 75 connected to receive an output signal of inverter 74. Clocked inverter 78 is connected to receive column address signal A1OC as an input signal, inverts the input signal according to control signal SSET, and supplies an output signal to terminator 72 of shifting circuit 73.

Clock signals $\phi 21$ and $\phi 22$ are respectively supplied as signal B to two circuits with the circuit construction of FIG. 20. The operation of the circuit is similar to that of the circuit of FIG. 12. In the circuit receiving clock signal $\phi 21$ as signal B, clock signal $\phi 31$ is generated as output signal C from shifting circuit 76, and in the circuit receiving clock signal $\phi 22$ as signal B, clock signal $\phi 32$ is generated as output signal C. The relation between input and output signals B and C of the FIG. 20 circuit is shown in Table 4.

TABLE 4

| B | $\phi 21$ | $\phi 22$ |
|---|---|---|
| C | $\phi 31$ | $\phi 32$ |

The circuit of FIG. 21 includes half bit shifting circuit 83 for shifting input signal by a half bit of signal $\bar{D}$, half bit shifting circuit 86 for shifting an output signal from shifting circuit 83 by a half bit of signal D, inverter 87 for feeding an output signal of shifting circuit 86 back to shifting circuit 83 as an input signal, clocked NAND circuit 88, and inverter 89 for inverting an output signal of shifting circuit 86. Shifting circuit 83 includes clocked inverter 81 for inverting an input signal in synchronism with signal $\bar{D}$ and terminator circuit 82 connected to receive an output signal of inverter 81, and shifting circuit 86 includes clocked inverter circuit 84 for inverting an output signal of shifting circuit 83 in synchronism with signal D and terminator circuit 85 connected to receive an output signal of inverter 84. Clocked NAND circuit 88 is connected to receive row address signal A9R or inverted row address signal $\overline{A9R}$ and row address signal A10R or inverted row address signal $\overline{A10R}$ as input signals, and is operated according to control signal SSET to supply an output signal to terminator 82 of shifting circuit 83.

Four circuits with the circuit construction of FIG. 21 are provided. In the first circuit, clock signal $\phi 31$ is supplied as signal D and address signals $\overline{A9R}$ and $\overline{A10R}$ are supplied as address signals to NAND circuit 88; in the second circuit, clock signal $\overline{\phi 31}$ is supplied as signal D and address signals A9R and $\overline{A10R}$ supplied as address signals to NAND circuit 88; in the third circuit, clock signal $\phi 32$ is supplied as signal D and address signals $\overline{A9R}$ and A10R are supplied as address signals to NAND circuit 88; and in the fourth circuit, clock signal $\phi 32$ is supplied as signal D and address signals A9R and A10R are supplied as address signals to NAND circuit 88.

Table 5 shows the relation between the input and output signals of the circuit in FIG. 21.

TABLE 5

| | Row Address | | | |
|---|---|---|---|---|
| | $\overline{A9R}$ $\overline{A10R}$ | A9R $\overline{A10R}$ | $\overline{A9R}$ A10R | A9R A10R |
| D | $\phi 31$ | $\overline{\phi 31}$ | $\phi 32$ | $\overline{\phi 32}$ |
| E | $\phi 33$ | $\phi 35$ | $\phi 34$ | $\phi 36$ |
| F | $\overline{\phi 33}$ | $\overline{\phi 35}$ | $\overline{\phi 34}$ | $\overline{\phi 36}$ |

As is shown in Table 5, in the first circuit in which clock signal $\phi 31$ is supplied as signal D and address signals $\overline{A9R}$ and $\overline{A10R}$ are supplied as address signals to NAND circuit 88, clock signals $\overline{\phi 33}$ and are respectively produced as output signals E and F from shifting circuit 86 and inverter 89. In the second circuit in which clock signal $\overline{\phi 31}$ is supplied as signal D and address signals A9R and A10R are supplied as address signals to NAND circuit 88, clock signals $\overline{\phi 35}$ and $\phi 35$ are respectively produced as output signals E and F from shifting circuit 86 and inverter 89. In the third circuit in which clock signal $\phi 31$ is supplied as signal D and address signals $\overline{A9R}$ and $\overline{A10R}$ are supplied as address signals $\overline{A9R}$ and A10R are supplied as address signals to NAND circuit 88, clock signals $\phi 34$ and $\overline{\phi 34}$ are respectively produced as output signals E and F from shifting circuit 86 and inverter 89. In the fourth circuit in which clock signal $\overline{\phi 32}$ is supplied as signal D and address signals A9R and A10R are supplied as address signals to NAND circuit 88, clock signals $\phi 36$ and $\overline{\phi 36}$ are respectively produced as output signals E and F from shifting circuit 86 and inverter 89.

The circuit of FIG. 22 includes delay circuit 91 for delaying signal G by a predetermined period of time, inverter 92 for inverting an output signal of delay circuit 91, NAND circuit 93 connected to receive an output signal of inverter 92 and signal G, delay circuit 94 for delaying signal H by a predetermined period of time, inverter 95 for inverting an output signal of delay circuit 94, NAND circuit 96 connected to receive an output signal of inverter 95 and signal H, NAND circuit 97 connected to receive signals I and J, inverter 98 for inverting an output signal of NAND circuit 97, NAND circuit 99 connected to receive an output signal of NAND circuit 97 and control signal $\overline{SSET}$, and NAND circuit 100 connected to receive an output signal of inverter 98 and control signal $\overline{SSET}$. Further, two NAND circuits 101 and 102 are provided to constitute a flip-flop 03. Input and output terminals of NAND circuit 101 are respectively connected to output and input terminals of NAND circuit 102, and NAND circuits 101 and 102 are respectively connected to receive output signals from NAND circuits 93 and 99 and output signals from NAND circuits 96 and 100.

If clock signals $\phi 31$ and $\phi 32$ derived from the circuit of FIG. 20, clock signals $\phi 33$ to $\phi 36$ derived from the circuit of FIG. 21 and inverted signals of these signals are selectively supplied as input signals G, H, I and J to the circuit of FIG. 22, one of clock signals $\phi 23$ to $\phi 30$ can be derived as output signal K from flip-flop 103.

Table 6 shows the relation between input and output signals of eight circuits which have the circuit construction shown in FIG. 22 and used to generate clock signals $\phi 23$ to $\phi 30$ for performing data reaadout or read-/write operation in the serial mode in the FIG. 13 embodiment.

TABLE 6

| G | $\overline{\phi 36}$ | $\phi 34$ | $\phi 36$ | $\overline{\phi 34}$ | $\phi 33$ | $\phi 35$ | $\overline{\phi 33}$ | $\overline{\phi 35}$ |
|---|---|---|---|---|---|---|---|---|
| H | $\phi 34$ | $\phi 36$ | $\overline{\phi 34}$ | $\overline{\phi 36}$ | $\phi 35$ | $\overline{\phi 33}$ | $\overline{\phi 35}$ | $\phi 33$ |
| I | A9R | A9R | $\overline{A9R}$ | $\overline{A9R}$ | A9R | A9R | $\overline{A9R}$ | $\overline{A9R}$ |
| J | A10R | $\overline{A10R}$ | A10R | $\overline{A10R}$ | A10R | $\overline{A10R}$ | A10R | $\overline{A10R}$ |
| K | $\phi 23$ | $\phi 24$ | $\phi 25$ | $\phi 26$ | $\phi 27$ | $\phi 28$ | $\phi 29$ | $\phi 30$ |

Likewise, Table 7 shows the relation between input and output signals of eight circuits which have the circuit construction shown in FIG. 22 and are used to generate clock signals $\phi 23$ to $\phi 30$ for performing data write-in operation in the serial mode in the FIG. 13 embodiment.

TABLE 7

| G | $\overline{\phi 36}$ | $\phi 34$ | $\phi 36$ | $\overline{\phi 34}$ | $\phi 33$ | $\phi 35$ | $\overline{\phi 33}$ | $\overline{\phi 35}$ |
|---|---|---|---|---|---|---|---|---|
| H | $\phi 34$ | $\phi 36$ | $\overline{\phi 34}$ | $\overline{\phi 36}$ | $\phi 35$ | $\overline{\phi 33}$ | $\overline{\phi 35}$ | $\phi 33$ |
| I | A9R | A9R | $\overline{A9R}$ | $\overline{A9R}$ | A9R | A9R | $\overline{A9R}$ | $\overline{A9R}$ |
| J | A10R | A10R | A10R | A10R | A10R | A10R | A10R | A10R |

TABLE 7-continued

| K | φ30 | φ27 | φ28 | φ29 | φ23 | φ24 | φ25 | φ26 |
|---|-----|-----|-----|-----|-----|-----|-----|-----|

FIG. 23 is a circuit diagram showing the circuit construction of a DRAM according to a third embodiment of this invention. In the FIG. 3 embodiment, data buses are divided into two: readout data buses 12A to 12D and write-in data buses 13A to 13D. However, in the DRAM of this embodiment, data buses 110A to 110D are commonly used for data readout and write-in. In this case, I/O data selection multiplexer 120 which can selectively supply data to and from data buses 110A to 110D is used instead of output data selection multiplexer 15 and input data selection multiplexer 20 in FIG. 3.

FIG. 24 is circuit diagram showing the circuit construction of a DRAM according to a fourth embodiment of this invention. The DRAM of this embodiment can be attained by modifying the FIG. 13 embodiment in the same manner as the modification made on the FIG. 23 embodiment. In the FIG. 13 embodiment, data buses are divided into two: readout data buses 12A and 12 and write-in data buses 13A and 13D, but in the DRAM of this embodiment, data buses 110A and 110D are commonly used for data readout and write-in. Also in this embodiment, I/O data selection multiplexer 120B which can selectively supply data to and from data buses 110A and 110B is used instead of output data selection multiplexer 15B and input data selection multiplexer 20B in FIG. 3.

FIG. 25 is a circuit diagram showing the circuit construction of a DRAM according to a fifth embodiment of this invention. In the FIG. 3 embodiment, data buses for data readout and data write-in are each constituted by a pair of data lines. However, in the DRAM of this embodiment, each data bus is constituted by a single data line. This causes the wiring are to be made smaller, reducing the chip size.

FIG. 26 is a circuit diagram showing the circuit construction of a DRAM according to a sixth embodiment of this invention. This embodiment can be attained by modifying the FIG. 13 embodiment in the same manner as the modification made on the FIG. 25 embodiment. That is, in the DRAM of this embodiment, data buses 12A, 12B, 13A and 13B are each constituted by a single data line, thus reducing the chip area.

FIG. 27 is a circuit diagram showing the circuit construction of a DRAM according to a seventh embodiment of this invention. This embodiment can be attained by modifying the FIG. 23 embodiment in the same manner as the modification made on the FIG. 25 embodiment.

FIG. 28 is a circuit diagram showing the circuit construction of a DRAM according to an eighth embodiment of this invention. This embodiment ca be attained by modifying the FIG. 24 embodiment in the same manner as the modification made on the FIG. 25 embodiment. The least number of data lines, or only two data lines are used in this embodiment.

With the DRAMs of the third to eighth embodiments, the wiring area for the data buses can be made small as compared with the prior art case, thus reducing the chip area. Further, a sufficiently long time is provided to transfer data via the data buses, making it possible to perform data readout and write-in operations.

This invention is not limited to the embodiments described above and can be modified without departing the technical scope of this invention. For example, in the above embodiments, the operation of serial data access in the byte mode has been explained. However, it is also possible to perform serial access in the unit of four bits, or in the nibble mode, or other number of bits.

Figure 29:
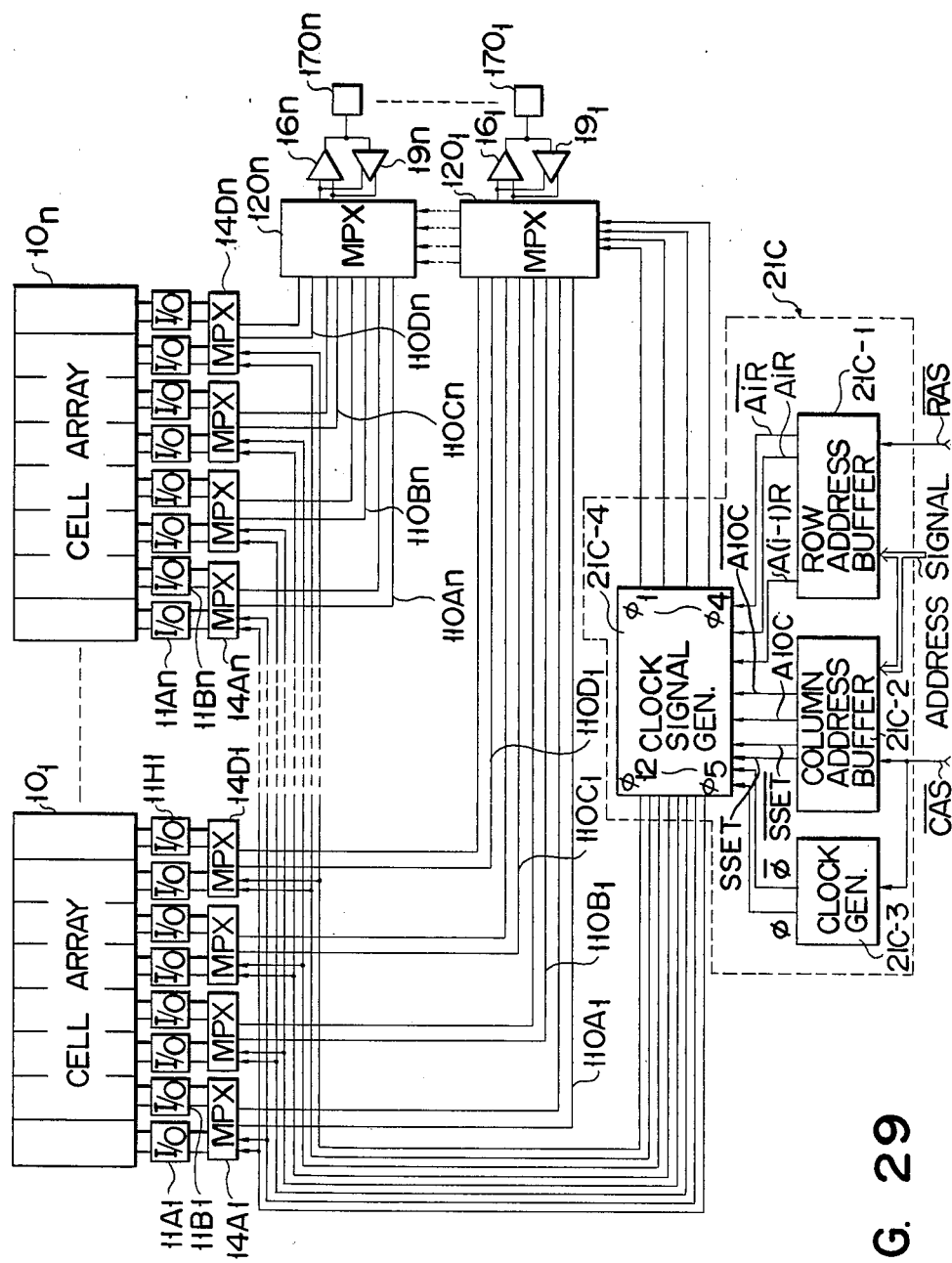

Further, in the above embodiment, the byte mode address is effected to deal with data of one-bit construction, but it is also possible to deal with data of n-bit construction. For example, in order to modify the FIG. 23 embodiment into an n-bit construction type DRAM, n memory cell arrays $10_l$ to $10n$, n groups of I/O buffers 11A1 to 11H1; ...; and 11An to 11Hn, n groups of selection multiplexers 14A1 to 14D1; ...; and 14An to 14Dn, n selection multiplexers $120_l$ to $120n$, and control circuit 21 for controlling the selection multiplexers are provided as shown in FIG. 29. Further, n sets of data buses 110A1 to 110D1; ...; and 110An to 110Dn are connected between n groups of selection multiplexers 14A1 to 14D1; ...; and 14An to 14Dn and n selection multiplexers $120_l$ to $120n$, and input and output drivers $16_l$ to $19_l$ to $16n$ and $19n$ are respectively connected to selection multiplexers $120_l$ to $120n$. In FIG. 29, like reference numerals used in FIG. 23 is used to denote the parts corresponding to those in FIG. 23. Control circuit 21C is similar to control circuit 21 of FIG. 3 except that address buffers 21C-1 and 21C-2 are provided to generate AiR, $\overline{AiR}$, AiC, $\overline{AiC}$ and A(i−1)R in response to signals $\overline{RAS}$, $\overline{CAS}$ and address signals. In this case, clock signals from control circuit 21C can be commonly used for respective data paths including n sets of data buses 110A1 to 110D1; . . . ; and 110An to 110Dn.

What is claimed is:

1. A semiconductor memory device comprising:
   at least one memory cell array means having N memory blocks;
   n buffer means for temporarily storing data to be transferred with respect to said memory means, respectively connected to said memory blocks and divided into n groups;
   n buffer selection means for selecting data transferred to and from said buffer means and each connected to a corresponding group of said buffer means;
   driver means;
   data selection means for selecting data transferred to and from said driver means;
   n data buses for transferring data between said n buffer selection means and said data selection means; and
   control means for supplying control signals to said buffer selection means and data selection means in each operation cycle, causing one of said buffer means belonging to a corresponding one of said groups of buffers to be selectively connected to a corresponding one of said data buses via a corresponding one of said buffer selection means, and causing said data buses to be sequentially connected to said driver means via said data selection means, thereby permitting serial data to be transferred with respect to said memory means via said data buses.

2. A semiconductor memory device according to claim 1, wherein said data selection means includes first and second data selection circuits each connected to said data buses, and said driver means includes first and second driver circuits respectively connected to said first and second data selection circuits.

3. A semiconductor memory device according to claim 2, wherein each of said data buses includes a pair of data lines.

4. A semiconductor memory device according to claim 2, wherein each of said data buses includes a single data line.

5. A semiconductor memory device according to claim 1, wherein said driver means includes first and second driver circuits commonly connected to said data selection means.

6. A semiconductor memory device according to claim 5, wherein each of said data buses includes a pair of data lines.

7. A semiconductor memory device according to claim 5, wherein each of said data buses includes a single data line.

8. A semiconductor memory device according to claim 1, wherein said memory cell array means includes M memory cell arrays each having N memory blocks, and said data selection means includes M data selection circuits respectively connected to said M memory cell arrays via said data buses, buffer selection means, and buffer means.

* * * * *